(12) United States Patent
Tsuri et al.

(10) Patent No.: US 10,897,841 B2
(45) Date of Patent: Jan. 19, 2021

(54) ROTARY HEAD OF A SURFACE MOUNTER

(71) Applicant: Yamaha Hatsudoki Kabushiki Kaisha, Iwata (JP)

(72) Inventors: Kenji Tsuri, Iwata (JP); Tomoyoshi Utsumi, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 267 days.

(21) Appl. No.: 15/764,288

(22) PCT Filed: Oct. 1, 2015

(86) PCT No.: PCT/JP2015/077955
§ 371 (c)(1),
(2) Date: Mar. 28, 2018

(87) PCT Pub. No.: WO2017/056295
PCT Pub. Date: Apr. 6, 2017

(65) Prior Publication Data
US 2018/0288911 A1    Oct. 4, 2018

(51) Int. Cl.
*B23P 19/00* (2006.01)
*H05K 13/04* (2006.01)
*F16K 31/04* (2006.01)

(52) U.S. Cl.
CPC ......... *H05K 13/0408* (2013.01); *F16K 31/04* (2013.01); *H05K 13/041* (2018.08); *H05K 13/0413* (2013.01)

(58) Field of Classification Search
CPC ............. H05K 13/0408; H05K 13/041; H05K 13/0413; F16K 31/04
See application file for complete search history.

(56) References Cited

U.S. PATENT DOCUMENTS 7,302,755 B2 * 12/2007 Ricketson .......... H05K 13/0413
29/743
2017/0099753 A1 * 4/2017 Iwasaki ............. H05K 13/0408
(Continued)

FOREIGN PATENT DOCUMENTS

JP    2009-171660 A    7/2009
JP    2012-164881 A    8/2012
(Continued)

OTHER PUBLICATIONS

An Office Action issued by the State Intellectual Property Office of the People's Republic of China dated Mar. 13, 2020, which corresponds to Chinese Patent Application No. 201580083390.6 and is related to U.S. Appl. No. 15/764,288. with English language translation.
(Continued)

*Primary Examiner* — Paul D Kim
(74) *Attorney, Agent, or Firm* — Studebaker & Brackett PC

(57) ABSTRACT

A rotary head of a surface mounter includes a rotating body, an N-shaft servo motor configured to rotate and drive the rotating body and a plurality of suction nozzles attached to the rotating body in such a manner as to be movable in a direction of a rotation axis. The plurality of suction nozzles are arranged on a virtual circle with the rotation axis as the center, and the plurality of suction nozzles are configured to hold and release a component. The rotary head of a surface mounter further includes a Z-axis drive device including a Z-axis linear motor. The Z-axis drive device is configured to use the Z-axis linear motor to move, in the direction of the rotation axis, the suction nozzle that has moved to a predetermined drive position on the virtual circle.

18 Claims, 13 Drawing Sheets

(56) References Cited

U.S. PATENT DOCUMENTS

| | | | | |
|---|---|---|---|---|
| 2017/0325369 A1* | 11/2017 | Iisaka | ................... | H05K 13/08 |
| 2018/0270999 A1* | 9/2018 | Tsuri | ..................... | H05K 13/04 |
| 2018/0376632 A1* | 12/2018 | Utsumi | ................. | H05K 13/04 |

FOREIGN PATENT DOCUMENTS

| | | |
|---|---|---|
| JP | 2013-069798 A | 4/2013 |
| JP | 2013-143851 A | 7/2013 |
| WO | 2015/063934 A1 | 5/2015 |

OTHER PUBLICATIONS

International Search Report issued in PCT/JP2015/077955; dated Jan. 12, 2016.
An Office Action mailed by the Japanese Patent Office dated Dec. 18, 2018, which corresponds to Japanese Patent Application No. 2017-542642 and is related to U.S. Appl. No. 15/764,288.
An Office Action mailed by the China National Intellectual Property Administration dated Jul. 31, 2020, which corresponds to Chinese Patent Application No. 201580083390.6 and is related to U.S. Appl. No. 15/764,288 with English language translation.

* cited by examiner

ROTARY HEAD OF A SURFACE MOUNTER

CROSS-REFERENCE TO RELATED APPLICATION

This application is a National Stage of International Patent Application No. PCT/JP2015/077955, filed Oct. 1, 2015, the entire content of which is incorporated herein by reference.

BACKGROUND

Technical Field

The technology disclosed in the description relates to a rotary head and a surface mounter.

Background Art

Among surface mounters that are configured to mount electronic components onto printed boards, those which include a mounting head (what is called a rotary head) having a rotating body and a plurality of suction nozzles (component holding members) attached to the rotating body in such a manner as to be movable in a direction of a rotation axis, arranged on a virtual circle with the rotation axis as the center, and configured to cause a component to adhere to a distal end portion thereof by using negative pressure and release the adhering component by using positive pressure are conventionally known.

Among rotary heads of this type, those which include a suction nozzle drive unit that moves the suction nozzle in the direction of the rotation axis of the rotating body, and a valve drive unit that moves, to a positive or negative pressure supply position, a valve for switching pressure supplied to the suction nozzle between the positive pressure and the negative pressure are known as described, for example, in Japanese Unexamined Patent Publication No. 2013-69798. Specifically, a double rotary head described in Japanese Unexamined Patent Publication No. 2013-69798 includes a holding shaft lifting device that advances and retreats a nozzle holding shaft by an electric motor, and a switching device that switches the position of a valve spool by a linear motor.

SUMMARY

If a rotary motor such as an electric motor is used to drive a suction nozzle or a valve, a mechanism is required which converts the rotary motion of the electric motor into the linear motion of the suction nozzle or valve. Accordingly, the drive unit results in being increased in size. Contrarily, the linear motor does not require such a mechanism. Accordingly, the drive unit can be reduced in size. Consequently, the rotary head can be reduced in size.

The rotary head, however, needs to cause one drive unit to drive a plurality of suction nozzles or a plurality of valves; therefore, the operating load of the drive unit is increased. Hence, if a linear motor is used as a drive source of the drive unit, a coil of the linear motor generates heat to thermally deform the rotary head. Consequently, the precision of placement of components may be reduced. Especially, aluminum has a high linear expansion coefficient. Accordingly, when aluminum is used for a constituent component of the drive unit to reduce the weight of the rotary head, thermal deformation is likely to occur.

The above-mentioned double rotary head described in Japanese Unexamined Patent Publication No. 2013-69798 has room for improvement in terms of preventing such a reduction in the precision of placement due to heat generated by the linear motor.

In the description, a technology is disclosed which prevents a reduction in the precision of placement due to heat generated by a linear motor in a rotary head that drives a component holding member or valve by the linear motor, and a surface mounter.

The rotary head disclosed in the description is a rotary head of a surface mounter including a rotating body, a rotation drive unit configured to rotate and drive the rotating body, and a plurality of component holding members attached to the rotating body in such a manner as to be movable in a direction of a rotation axis. The plurality of component holding members are arranged on a virtual circle with the rotation axis as the center, with the plurality of component holding members being configured to hold and release a component. The rotary head of a surface mounter further includes a holding member drive unit including an opposed linear motor with a core. The holding member drive unit is configured to use the opposed linear motor with the core to move, in the direction of the rotation axis, the component holding member that has moved to a predetermined drive position on the virtual circle.

The above-mentioned linear motor disclosed in Japanese Unexamined Patent Publication No. 2013-69798 is a cylindrical linear motor, what is called a linear shaft motor. Specifically, the linear motor disclosed in Japanese Unexamined Patent Publication No. 2013-69798 is provided on the surface of a rod with a plurality of ring-shaped permanent magnets as a stator. A plurality of movers including coils is fitted to the outside of the stator with a gap therebetween. These movers move along an axial direction of the stator. The linear shaft motor generally has a low thrust density (the thrust that can be generated in relation to the volume of the motor). Accordingly, when the operating load is increased, heat is likely to be generated.

Contrarily, the opposed linear motor with the core has a higher thrust density than the linear shaft motor. Accordingly, when the motor is of the same size, even if its operating load is increased, heat is unlikely to be generated. Hence, according to the rotary head, it is possible to prevent a reduction in the precision of placement due to heat generated by the linear motor as compared to a case where the linear shaft motor is used.

Moreover, the holding member drive unit may be disposed around the rotating body on any virtual straight line orthogonal to the rotation axis in an orientation where a mover of the opposed linear motor with the core of the holding member drive unit moves in the direction of the rotation axis, and in an orientation where a stator and the mover of the opposed linear motor with the core are arranged in a tangent direction to the virtual circle at a point of intersection of the virtual circle and the virtual straight line.

According to the rotary head, the holding member drive unit is disposed around the rotating body in the orientation where the mover moves in the direction of the rotation axis. Accordingly, for example, it is possible to prevent the holding member drive unit from extending out in a direction of the virtual straight line as compared to, for example, a case where the holding member drive unit is disposed in an orientation where the mover moves in the direction of the virtual straight line. Furthermore, according to the rotary head, the holding member drive unit is disposed on any virtual straight line orthogonal to the rotation axis of the rotating body in the orientation where the stator and the mover are arranged in the tangent direction at the point of intersection of the above-mentioned virtual circle and the virtual straight line. Accordingly, it is possible to further prevent the holding member drive unit from extending out in the direction of the virtual straight line as compared to a case where the holding member drive unit is disposed in an orientation where the stator and the mover are inclined against the tangent direction (for example, a case where the holding member drive unit is disposed in an orientation where the stator and the mover are arranged in the direction of the virtual straight line).

In this manner, according to the rotary head, it is possible to prevent the holding member drive unit from extending out. Accordingly, it is possible to reduce a circle circumscribing the holding member drive unit (an outermost circle) with the rotation axis of the rotating body as the center. In other words, the rotary head can be made compact when viewed from the direction of the rotation axis of the rotating body. Consequently, it is possible to cause the rotary head to have a large range of motion in a direction perpendicular to the rotation axis of the rotating body.

Moreover, a first to-be-read member provided on an output shaft to which the mover of the opposed linear motor with the core is attached. The first to-be-read member extends substantially parallel to the output shaft on a side opposite to the stator of the opposed linear motor with the core across the output shaft. Also, a first position detection unit disposed on the side opposite to the output shaft across the first to-be-read member and configured to detect a position of the first to-be-read member may be further included.

For example, the output shaft is formed in a straight shape extending straight in the direction of the rotation axis of the rotating body. It is also possible to dispose the stator and the first position detection unit side by side in the direction of the rotation axis by using the extension portion as the to-be-read member. However, in this case, the output shaft is long in the direction of the rotation axis. Accordingly, it may be difficult to secure a space for disposing the holding member drive unit.

According to the rotary head, the output shaft is provided, on the side opposite to the stator across the output shaft, with the first to-be-read member extending substantially parallel to the output shaft. Accordingly, the length of the output shaft in the direction of the rotation axis can be reduced. Consequently, even if it is difficult to secure the space for disposing the holding member drive unit when the output shaft is long in the direction of the rotation axis, it is easy to secure the space for disposing the holding member drive unit.

Moreover, the component holding member may be a suction nozzle that causes the component to adhere thereto by using negative pressure and releases the adhering component by using positive pressure. Also, the rotary head may further include a plurality of valves attached to the rotating body in such a manner as to be movable between a negative pressure supply position that supplies the negative pressure to the suction nozzle and a positive pressure supply position that supplies the positive pressure to the suction nozzle, and a valve drive unit including an opposed linear motor with a core. The valve drive unit is configured to use the opposed linear motor with the core to move the valve corresponding to the suction nozzle that has moved to the drive position, between the negative pressure supply position and the positive pressure supply position.

The opposed linear motor with the core has a high thrust density than a linear shaft motor. Accordingly, when the motor is of the same size, even if its operating load is increased, heat is unlikely to be generated. Accordingly, according to the rotary head, it is possible to prevent a reduction in the precision of placement due to heat generated by the linear motor.

Moreover, the rotary head disclosed in the description is a rotary head of a surface mounter including a rotating body, a rotation drive unit configured to rotate and drive the rotating body, and a plurality of suction nozzles attached to the rotating body in such a manner as to be movable in a direction of a rotation axis. The plurality of suction nozzles are arranged on a virtual circle with the rotation axis as the center. Also, the plurality of suction nozzles are configured to cause a component to adhere to a distal end portion thereof by using negative pressure and release the adhering component by using positive pressure. The rotary head of a surface mounter also includes a holding member drive unit configured to move, in the direction of the rotation axis, the suction nozzle that has moved to a predetermined drive position on the virtual circle, and a plurality of valves attached to the rotating body in such a manner as to be movable between a negative pressure supply position that supplies the negative pressure to the suction nozzle and a positive pressure supply position that supplies the positive pressure to the suction nozzle. The rotary head of a surface mounter further includes a valve drive unit including an opposed linear motor with a core. The valve drive unit is configured to use the opposed linear motor with the core to move the valve corresponding to the suction nozzle that has moved to the drive position, between the negative pressure supply position and the positive pressure supply position.

The opposed linear motor with the core has a higher thrust density than a linear shaft motor. Accordingly, when the motor is of the same size, even if its operating load is increased, heat is unlikely to be generated. Hence, according to the rotary head, it is possible to prevent a reduction in the precision of placement due to heat generated by the linear motor.

Moreover, the valve drive unit may be disposed around the rotating body on any virtual straight line orthogonal to the rotation axis in an orientation where a mover of the opposed linear motor with the core of the valve drive unit moves in the direction of the rotation axis, and in an orientation where a stator and the mover of the opposed linear motor with the core are arranged in a tangent direction to the virtual circle at a point of intersection of the virtual circle and the virtual straight line.

According to the rotary head, the rotary head can be made compact when viewed from the direction of the rotation axis of the rotating body. Consequently, it is possible to cause the rotary head to have a large range of motion in a direction perpendicular to the rotation axis of the rotating body. Moreover, the holding member drive unit and the valve drive unit may overlap each other when viewed from the direction of the rotation axis. If the holding member drive unit and the valve drive unit extend out in different directions when viewed from the direction of the rotation axis of the rotating body, the rotary head results in being increased in size when viewed from the direction of the rotation axis of the rotating body.

Contrarily, according to the rotary head described above, the valve drive unit and the holding member drive unit overlap each other when viewed from the direction of the rotation axis of the rotating body. Accordingly, the direction in which the holding member drive unit extends out is substantially the same as the direction in which the valve drive unit extends out. Hence, the rotary head can be reduced in size when viewed from the direction of the rotation axis of the rotating body as compared to the case where the valve drive unit and the holding member drive unit extend out in directions different from each other. Consequently, it is possible to cause the rotary head to have a large range of motion in the direction perpendicular to the rotation axis.

Moreover, a second to-be-read member provided on an output shaft to which the mover of the opposed linear motor with the core of the valve drive unit is attached. The second to-be-read member extends substantially parallel to the output shaft on a side opposite to the stator of the opposed linear motor with the core across the output shaft. A second position detection unit is disposed on the side opposite to the output shaft across the second to-be-read member and configured to detect a position of the second to-be-read member may be further included.

According to the rotary head described above, even if it is difficult to secure a space for disposing the valve drive unit when the output shaft is long in the direction of the rotation axis, it is easy to secure the space for disposing the valve drive unit.

Moreover, a surface mounter disclosed in the description includes a component mounting device having the rotary head as discussed above, and configured to mount the component onto a board. The surface mounter further includes a component feeding device configured to supply the component to the component mounting device, and a board transfer device configured to transfer the board to a mounting position of the component by the component mounting device.

According to the surface mounter described above, it is possible to prevent a reduction in the precision of placement due to heat generated by the linear motor. According to the rotary head and the surface mounter, which are disclosed in the description, it is possible to prevent a reduction in the precision of placement due to heat generated by the linear motor.

DETAILED DESCRIPTION

An embodiment is described with reference to FIGS. 1 to 13.

(1) Entire Configuration of Surface-Mount Placement Machine

Figure 1:
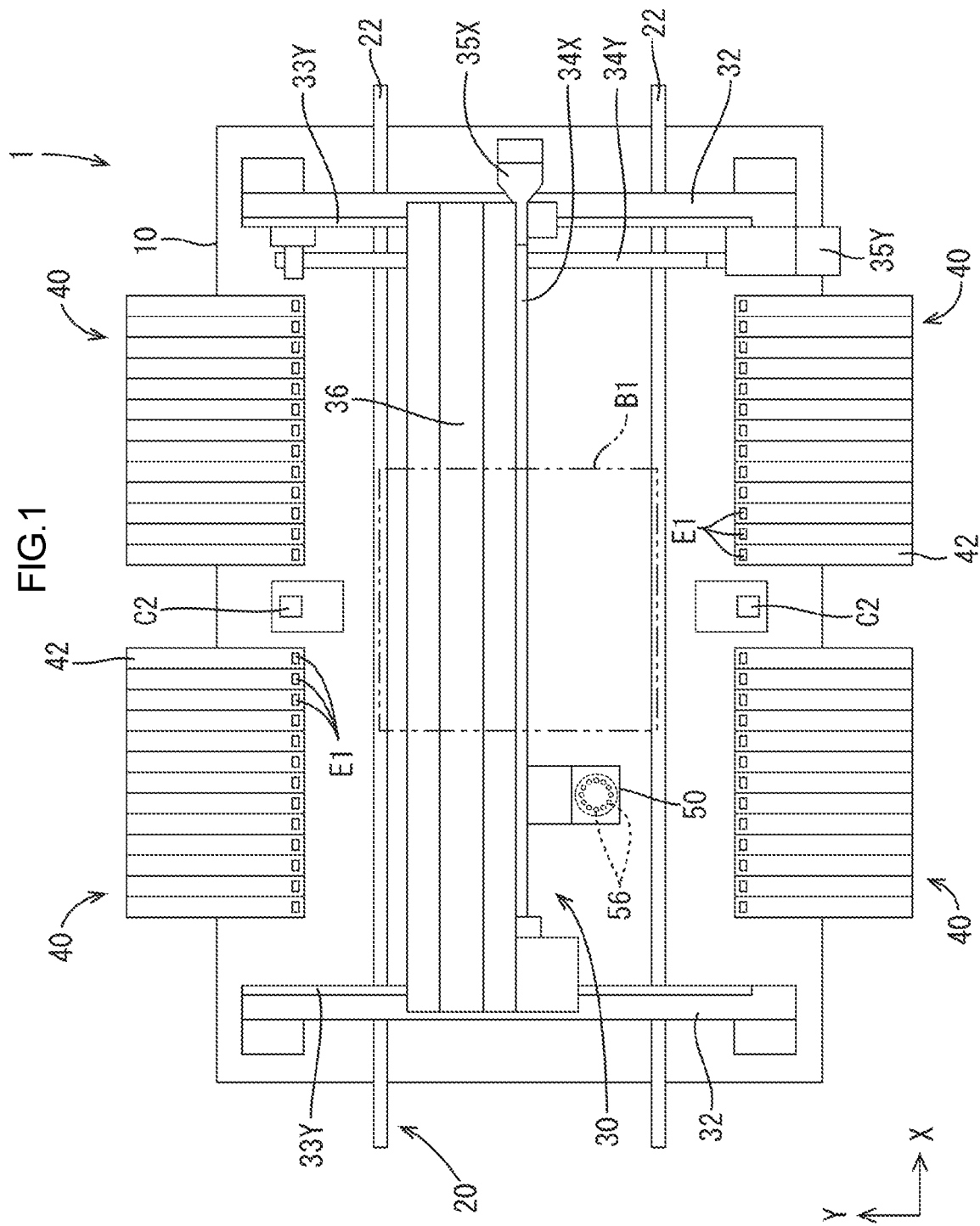
FIG. 1 is a plan view of a surface mounter.

As illustrated in FIG. 1, a surface mounter 1 according to the embodiment includes a base 10, a transfer conveyor 20 (an example of a board transfer device) for transferring a printed board B1 (an example of a board), a component mounting device 30 for placing an electronic component E1 (an example of a component) onto the printed board B1, and component feeding devices 40 for supplying the electronic component E1 to the component mounting device 30.

The base 10 is formed in a rectangular shape in plan view, and a top surface of the base 10 is flat. Moreover, for example, an unillustrated backup plate for backing the printed board B1 up at the time when the electronic component E1 is mounted on the printed board B1 is provided below the transfer conveyor 20 on the base 10. In the following description, let the long side of the base 10 (the left-and-right direction in FIG. 1) and the transfer direction of the transfer conveyor 20 be the X-axis direction, let the short side of the base 10 (the up-and-down direction in FIG. 1) be the Y-axis direction, and let the up-and-down direction of the base 10 (the up-and-down direction in FIG. 2) be the Z-axis direction.

The transfer conveyor 20 is disposed in a substantially center position of the base 10 in the Y-axis direction, and transfers the printed board B1 along the transfer direction (the X-axis direction). The transfer conveyor 20 includes a pair of conveyor belts 22 that is driven and circulated in the transfer direction. The printed board B1 is set in such a manner as to be disposed on and between both of the conveyor belts 22. The printed board B1 is carried in to an operation position (a position enclosed by a chain double-dashed line in FIG. 1) on the base 10 along the conveyor belts 22 from one side in the transfer direction (the right side illustrated in FIG. 1), and stopped there. After the operation of placing the electronic component E1 is performed, the printed board B1 is carried out to the other side (the left side illustrated in FIG. 1) along the conveyor belts 22.

The component feeding devices 40 are of a feeder type, and are disposed at four locations in all, arranged side by side in twos in the X-axis direction on both sides (both of the upper and lower sides of FIG. 1) of the transfer conveyor 20. A plurality of feeders 42 is arranged side by side and attached to each of these component feeding devices 40. Each feeder 42 includes a reel (not illustrated) around which a component supply tape (not illustrated) where a plurality of the electronic components E1 is stored is wound, and a motor-operated delivery device (not illustrated) that pulls the component supply tape from the reel. The electronic components E1 are supplied, one by one, in a component supply position provided at an end located on the transfer conveyor belt side.

The component mounting device 30 is configured including a pair of support frames 32 provided above the base 10, the component feeding devices 40 described below, and the like, a rotary head 50, and a rotary head drive mechanism that drives the rotary head 50. The support frames 32 are located on both sides of the base 10 in the X-axis direction, respectively, and extend in the Y-axis direction. An X-axis servo mechanism and a Y-axis servo mechanism, which configure the rotary head drive mechanism, are provided to the support frame 32. The rotary head 50 is designed to be movable in the X- and Y-axis directions within a fixed range of motion by using the X- and Y-axis servo mechanisms.

The Y-axis servo mechanism includes a Y-axis guide rail 33Y, a Y-axis ball screw 34Y threadedly engaging with an unillustrated ball nut, and a Y-axis servo motor 35Y. A head support 36 fixed to the ball nut is attached to each Y-axis guide rail 33Y. When the Y-axis servo motor 35Y is energized and controlled, the ball nut advances and retreats along the Y-axis ball screw 34Y. As a result, the head support 36 fixed to the ball nut, and the rotary head 50 described below move along the Y-axis guide rail 33Y in the Y-axis direction.

The X-axis servo mechanism includes an X-axis guide rail (not illustrated), an X-axis ball screw 34X threadedly engaging with an unillustrated ball nut, and an X-axis servo motor 35X. The rotary head 50 is attached to the X-axis guide rail in such a manner as to be movable along an axial direction of the X-axis guide rail. When the X-axis servo motor 35X is energized and controlled, the ball nut advances and retreats along the X-axis ball screw 34X. As a result, the rotary head 50 fixed to the ball nut moves along the X-axis guide rail in the X-axis direction.

(2) Configuration of Rotary Head

Figure 2:
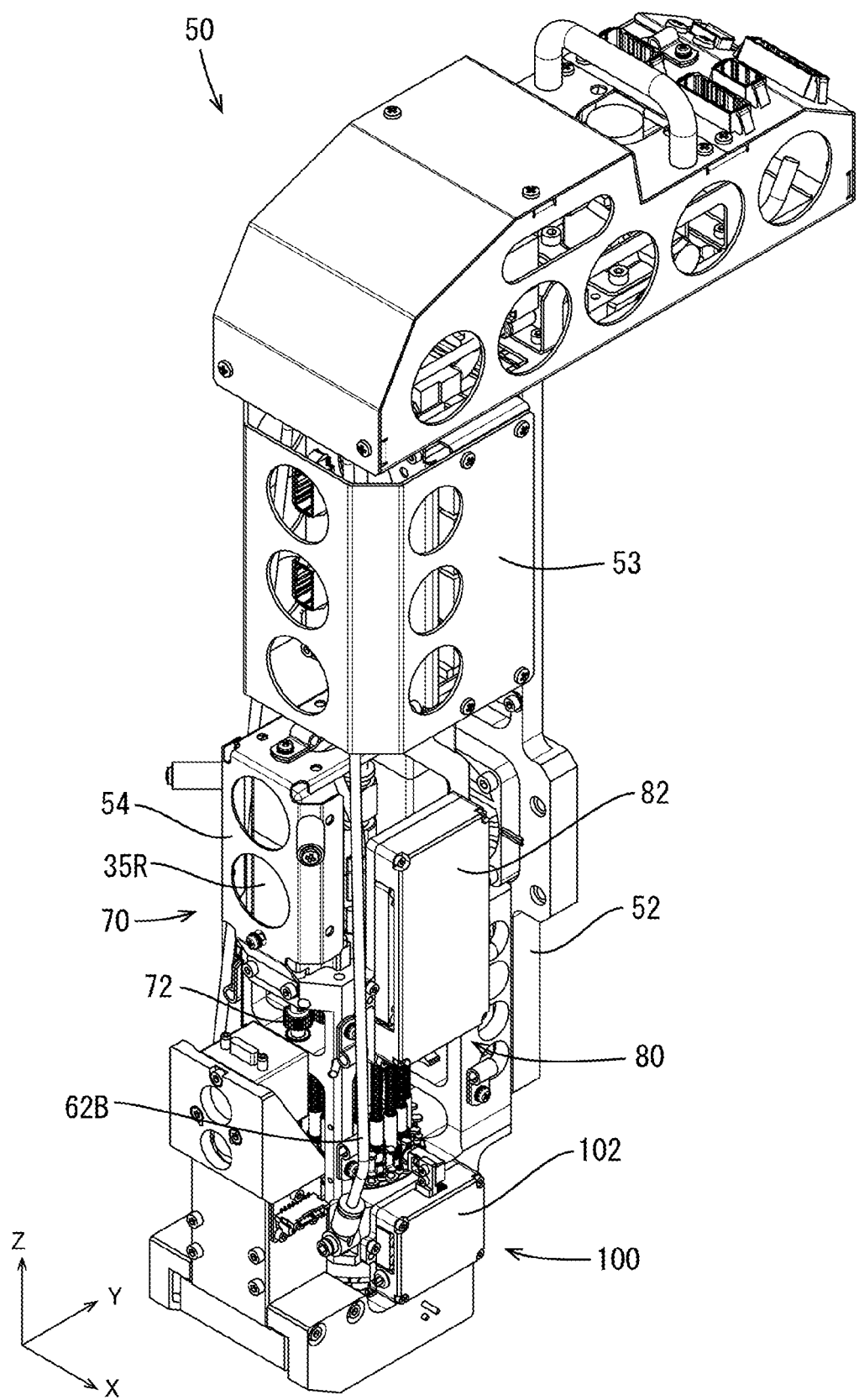
FIG. 2 is a perspective view of a rotary head.
Figure 4:
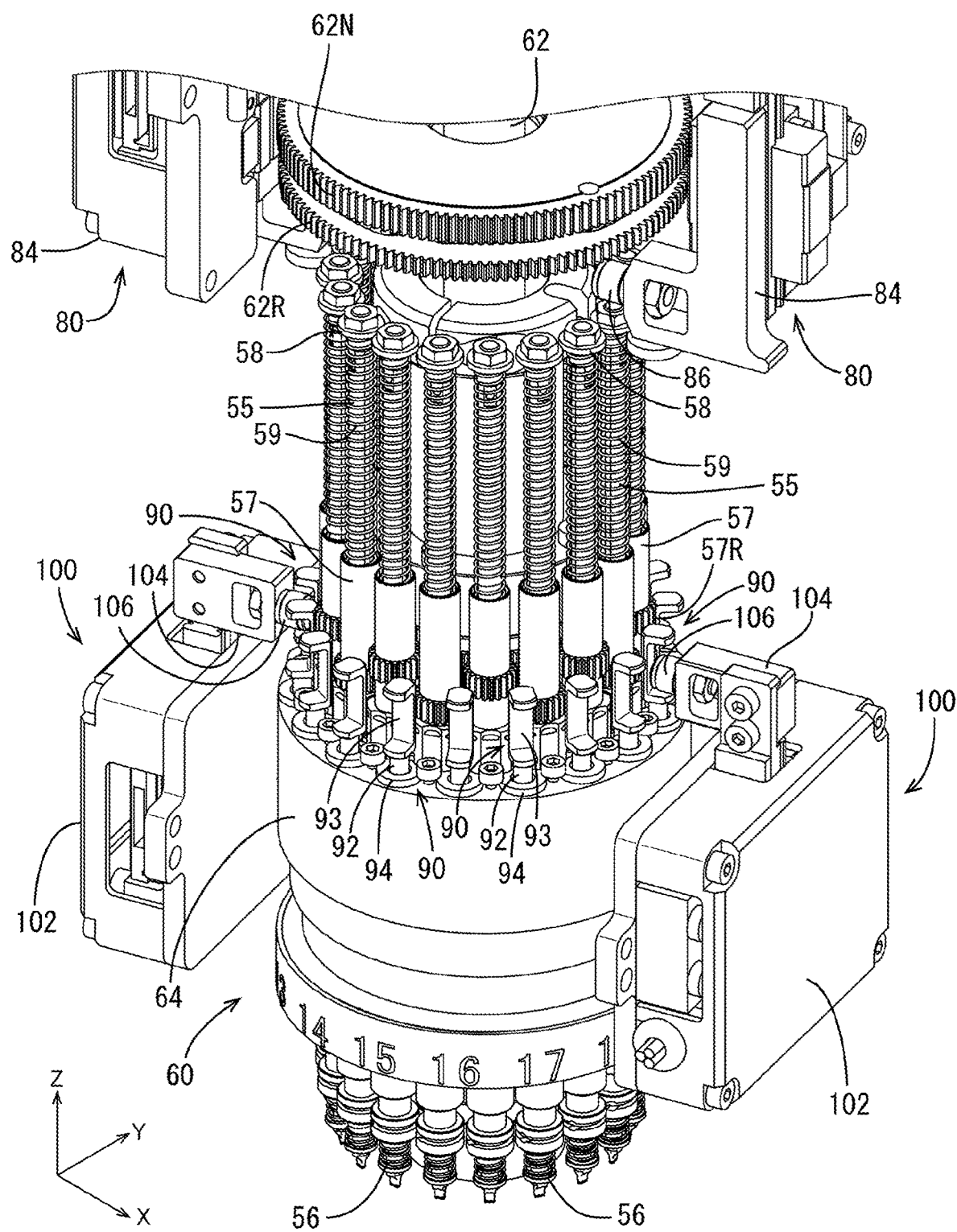
FIG. 4 is a perspective view illustrating a state where a distal end portion of each suction nozzle is exposed in FIG. 3.

Next, the configuration of the rotary head 50 is described in detail. As illustrated in FIG. 2, the rotary head 50 is formed in an arm shape where a head body portion 52 being a main body is covered by covers 53 and 54. The rotary head 50 causes the electronic component E1 supplied by the component feeding device 40 to adhere thereto and mounts the electronic component E1 onto the printed board B1. As illustrated in FIG. 4, 18 nozzle shafts 55 in all are supported in the distal end portion of rotary head 50 in such a manner as to be movable by a rotating body 60 in the Z-axis direction (the up-and-down direction).

The rotating body 60 includes a shaft portion 62 formed in a shaft shape along the Z-axis direction, and a shaft holding portion 64 provided around the shaft portion 62 to a lower end portion of the rotary head 50 and formed in a substantially columnar shape with a larger diameter than the shaft portion 62. The shaft portion 62 of the rotating body 60 is supported by the head body portion 52 in such a manner as to be bidirectionally rotatable (that is, pivotable) about the axis of the shaft portion 62. The shaft portion 62 has a double structure. An N-shaft driven gear 62N is provided around the axis of the shaft portion 62 to an upper portion of the inner shaft portion 62 (hereinafter referred to as the "N shaft"). An R-shaft driven gear 62R is provided around the axis of the shaft portion 62 to an upper portion of the outer shaft portion 62 (hereinafter referred to as the "R shaft").

An unillustrated N-shaft drive device (an example of a rotating drive unit) for rotating and driving the rotating body 60 is disposed in a substantially center portion of the rotary head 50 in the Z-axis direction. The N-shaft drive device includes an N-shaft servo motor 35N (refer to FIG. 7), and an N-shaft drive gear (not illustrated) provided around an output shaft of the N-shaft servo motor 35N. The N-shaft drive gear engages with the N-shaft driven gear 62N. When the N-shaft servo motor 35N is energized and controlled, the rotating body 60 is rotated at an arbitrary angle about the rotation axis along the Z-axis direction via the rotation and drive of the N-shaft drive gear and the N-shaft driven gear 62N.

Figure 5:
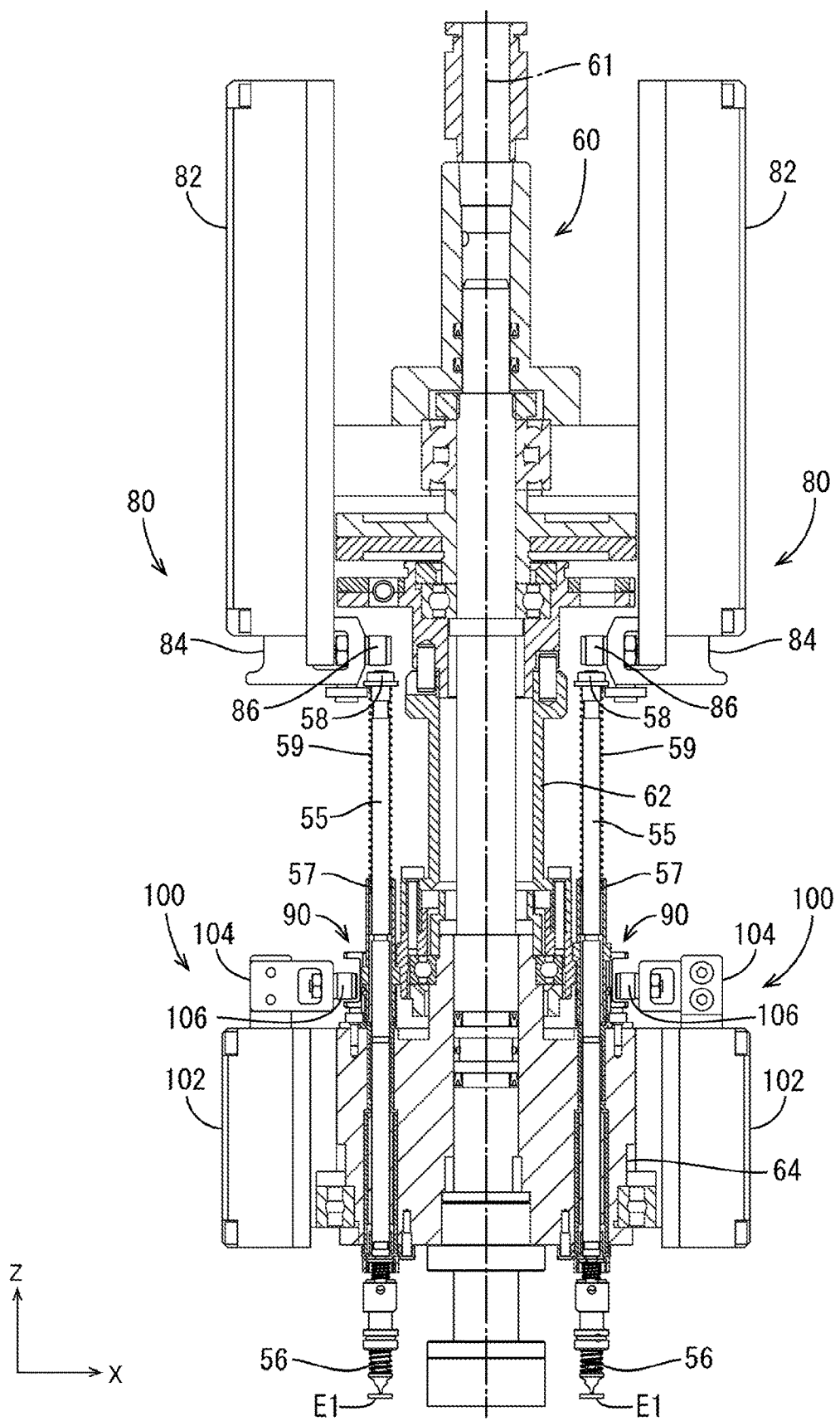
FIG. 5 is a cross-sectional view of a main part of the rotary head.

Eighteen through-holes are formed at regular intervals in the circumferential direction in the shaft holding portion 64 of the rotating body 60. The shaft-shaped nozzle shaft 55 is held through a tubular shaft holder 57 in the through-hole in a form of extending along the Z-axis direction while penetrating the shaft holding portion 64. As illustrated in FIGS. 4 and 5, a lower end portion of each nozzle shaft 55, which protrudes downward from the shaft holding portion 64, is provided with a suction nozzle 56 (an example of a component holding member) that causes the electronic component E1 to adhere thereto.

It is designed such that negative or positive pressure is supplied to each suction nozzle 56. Each suction nozzle 56 causes a distal end portion thereof to adhere to and hold the electronic component E1 by using the negative pressure, and releases the electronic component E1 held at the distal end portion by using the positive pressure. When the rotating body 60 is rotated by the N-shaft drive device, the suction nozzles 56 provided to the nozzle shafts 55, together with the nozzle shafts 55, are rotated about a rotation axis of the rotating body 60.

Moreover, as illustrated in FIG. 2, an R-shaft drive device 70 for rotating and driving each nozzle shaft 55 about an axis thereof is disposed in the substantially center portion of the rotary head 50 in the Z-axis direction. The R-shaft drive device 70 includes an R-shaft servo motor 35R, and an R-shaft drive gear 72R (refer to FIG. 3) provided around an output shaft of the R-shaft servo motor 35R to engage with the R-shaft driven gear 62R. An unillustrated common gear is provided to a portion, lower than the R-shaft driven gear 62R, of the outer shaft portion 62 provided with the R-shaft driven gear 62R.

On the other hand, as illustrated in FIG. 4, a part of each shaft holder 57 is provided, around a cylindrical shaft thereof, with a nozzle gear 57R. The nozzle gear 57R provided to the nozzle shaft 55 engages with the common gear. When the R-shaft servo motor 35R is energized and controlled, the common gear rotates via the rotation and drive of the R-shaft drive gear 72R and the R-shaft driven gear 62R.

When the common gear rotates, the shaft holders 57 are rotated by the engagement with the nozzle gears 57R. The shaft holder 57 and the nozzle shaft 55 are coupled through ball spline coupling. Accordingly, the 18 nozzle shafts 55 rotate all at once about axes thereof at the same angle in the same direction with the rotation of the common gear.

Moreover, a spring stop bolt 58 is threadedly engaged with an upper end portion of each nozzle shaft 55. A coiled spring 59 is disposed on an outer peripheral surface side of each nozzle shaft 55. The coiled spring 59 is disposed in a compressed manner between the spring stop bolt 58 and the shaft holder 57. The nozzle shaft 55 is biased upward by the elastic force of the coiled spring 59.

Figure 3:
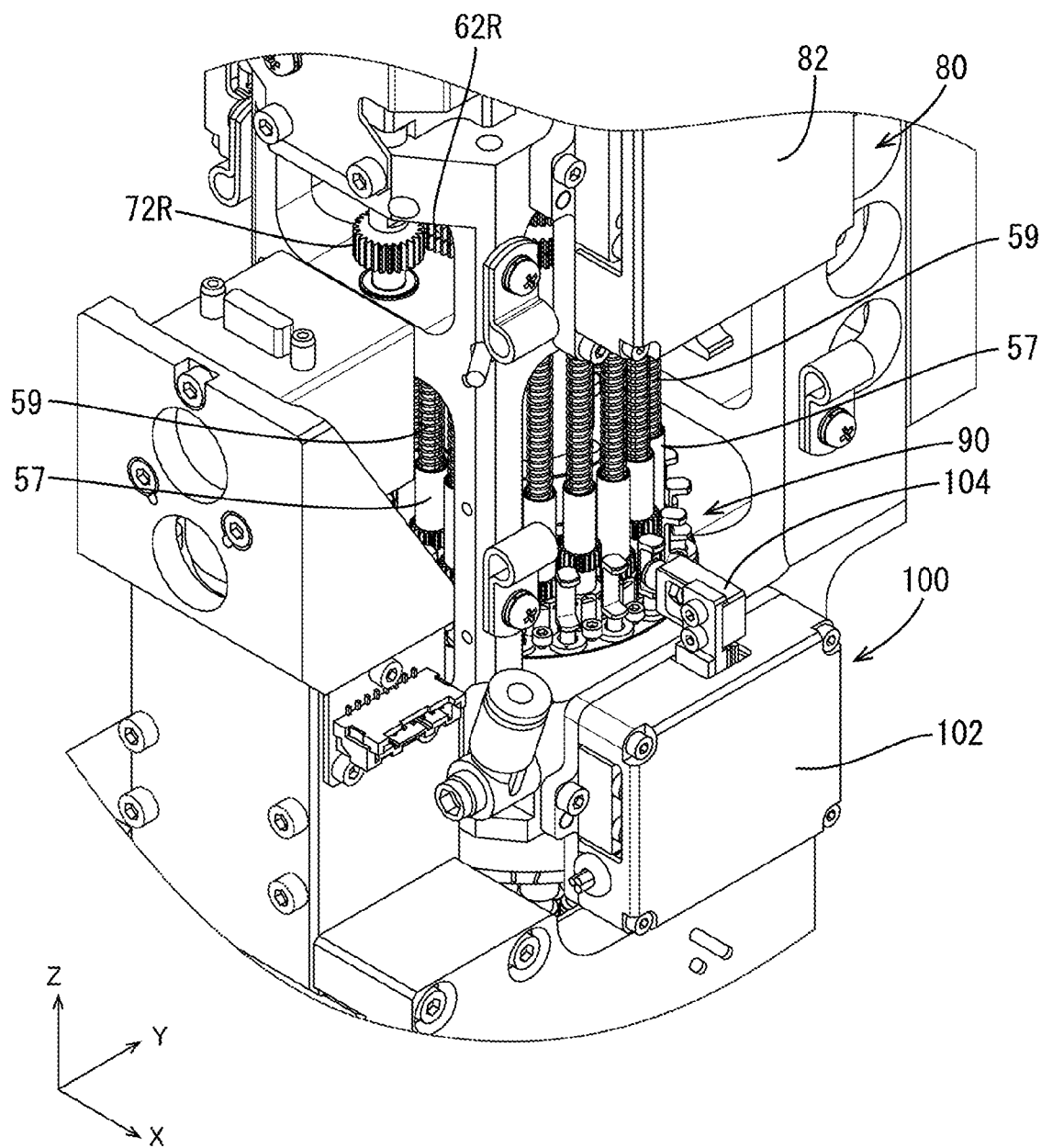
FIG. 3 is a perspective view where a part of the rotary head has been enlarged.

Moreover, as illustrated in FIGS. 2 to 4, the rotary head 50 includes two Z-axis drive devices 80 (an example of holding member drive units) for raising and lowering the nozzle shaft 55, among the 18 nozzle shafts 55, that has moved to a specific position (hereinafter referred to as the drive position) on the virtual circle 66 (refer to FIG. 10) where the nozzle shafts 55 are arranged, with respect to the rotating body 60 in a direction along the shaft portion 62 of the rotating body 60 (the Z-axis direction and the up-and-down direction). The two Z-axis drive devices 80 have the same structure as each other, and are symmetrically disposed on both of the left and right sides of the rotary head 50 with respect to the shaft portion 62 of the rotating body 60, above the nozzle shafts 55 (refer to FIG. 5).

As illustrated in FIGS. 3 to 5, the Z-axis drive device 80 includes a box-shaped Z-axis drive source 82 and a Z-axis moving portion 84 extending downward from the Z-axis drive source 82. A Z-axis linear motor 35Z for driving the Z-axis moving portion 84 with linear motor drive (refer to FIG. 7) is provided in the Z-axis drive source 82. The Z-axis moving portion 84 is supported in such a manner as to be movable with respect to the Z-axis drive source 82 in the direction along the shaft portion 62, and is raised and lowered by the Z-axis drive source 82 in the direction along the shaft portion 62.

Here, the Z-axis linear motor 35Z according to the embodiment is an opposed linear motor with a core, and more specifically, an opposed moving magnet linear motor with a core. The opposed moving magnet linear motor with the core is one where a coil as a stator is wound around the core, and a permanent magnet being a mover is provided in such a manner as to be movable in proximity to the coil.

The opposed linear motor with the core may be called an F-type linear motor. Moreover, the opposed linear motor with the core may be of a moving coil type including a permanent magnet as a stator and a coil as a mover. The Z-axis linear motor 35Z may be an opposed moving coil linear motor with a core. In terms of the moving coil type, wiring is complicated since an electric wire that energizes the coil moves together with the coil. However, in terms of the moving magnet type, wiring is unnecessary for the moving portion of magnet since the coil is fixed, and accordingly the wiring can be made simple as compared to the moving coil type.

As illustrated in FIGS. 4 and 5, a cam follower 86 (hereinafter referred to as the "Z-axis cam follower 86") is attached to a lower end portion of the Z-axis moving portion 84 of the Z-axis drive device 80 in such a manner as to be rotatable about an axis thereof along the X-axis direction. The Z-axis moving portion 84 is supported in an upward end position thereof by the Z-axis drive source 82 in a placement where the Z-axis cam follower 86 is close to the upper end portion (the spring stop bolt 58) of the nozzle shaft 55 in the drive position (refer to FIG. 5). Hence, rotation about the shaft portion 62 of each nozzle shaft 55 is allowed in a state where the Z-axis moving portion 84 is in the upward end position.

When the Z-axis drive source 82 lowers the Z-axis moving portion 84 from the upward end position, the Z-axis cam follower 86 comes into contact with the upper end portion of the nozzle shaft 55 in the drive position, and the nozzle shaft 55 is lowered against the elastic force of the coiled spring 59. When the nozzle shaft 55 is lowered, the suction nozzle 56 provided to the nozzle shaft 55 is lowered, and the distal end portion of the suction nozzle 56 comes close to the printed board B1 in the component supply position or operation position of the component feeding device 40. When the Z-axis moving portion 84 is raised from this state, the elastic force return force of the coiled spring 59 raises the nozzle shaft 55 and the suction nozzle 56.

Furthermore, the rotary head 50 includes switching devices 90 for switching pressure supplied to each suction nozzle 56 between the negative pressure and the positive pressure, as illustrated in FIGS. 4 and 5. Eighteen switching devices 90 in all are provided, corresponding respectively to the suction nozzles 56 (the nozzle shafts 55). The switching devices 90 are each provided between two adjacent nozzle shafts 55 outward of the nozzle shafts 55 disposed on the virtual circle 66 and are each spaced evenly on the circumference of a circle with the rotation axis of the virtual circle 66 as the center along the outer periphery of the shaft holding portion 64 as in the nozzle shafts 55 (refer to FIG. 4).

Figure 6:
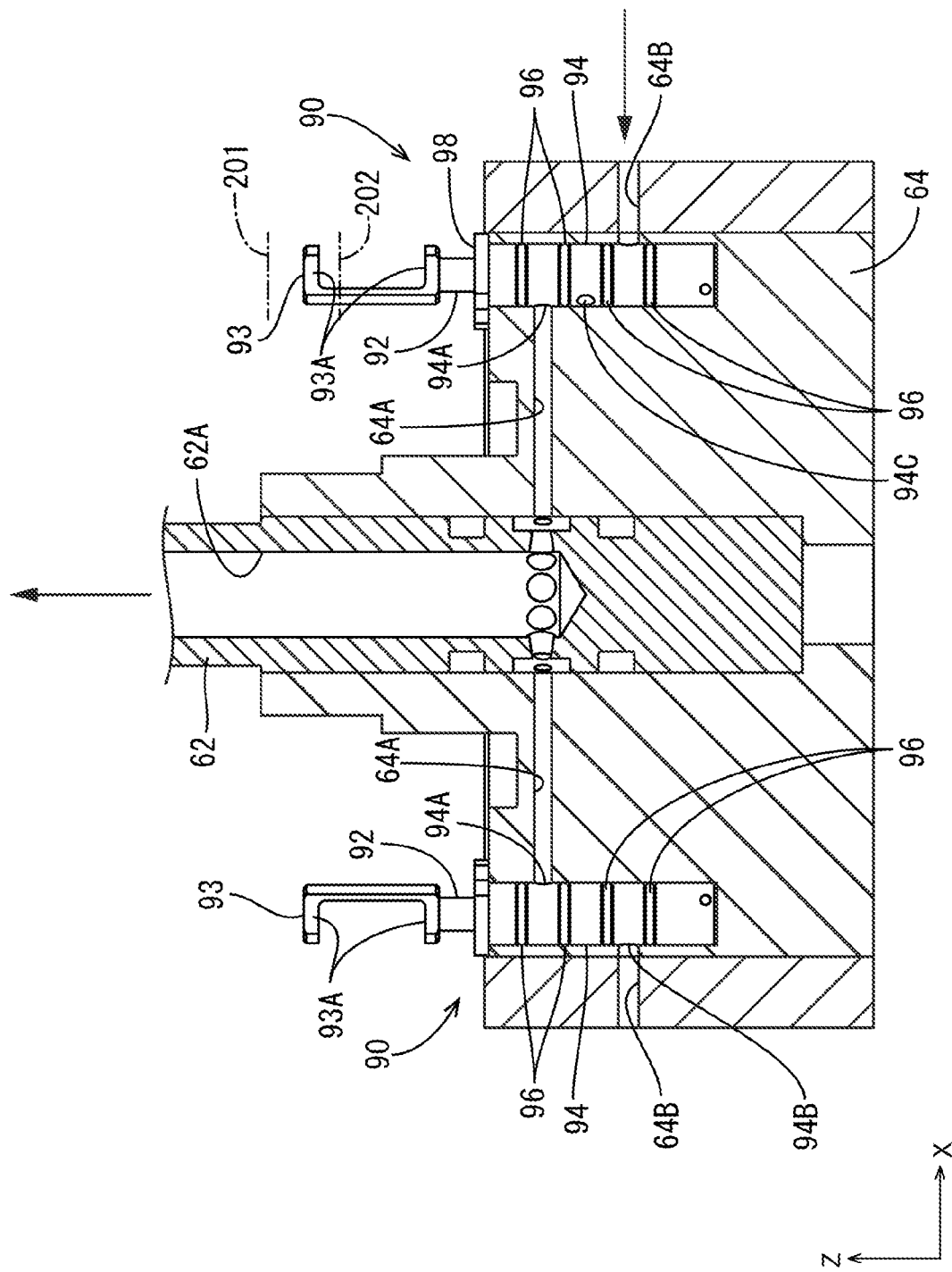
FIG. 6 is a cross-sectional view illustrating a part of the distal end portion (lower end portion) of the rotary head in a state where a valve spool is at a positive pressure supply position.

As illustrated in FIG. 6, each switching device 90 includes a shaft-shaped valve spool 92 (an example of a valve), and a tubular sleeve 94 where a lower portion of the valve spool 92 is housed. The sleeves 94 are attached respectively in mounting holes provided in the shaft holding portion 64. Specifically, the sleeve 94 is attached such that the entire sleeve 94 excluding a large-diameter portion 98 provided at an upper end of the sleeve 94 is inserted in the mounting hole. A lower portion (a major part excluding a contact portion 93 of the valve spool 92) of the valve spool 92 with respect to an opening of the large-diameter portion 98 exposed from the shaft holding portion 64 is housed in the sleeve 94 in such a manner as to be movable along a direction of the axis of the valve spool 92.

Each valve spool 92 is disposed in the sleeve 94, orienting the axial direction of the valve spool 92 in the Z-axis direction (the up-and-down direction). The valve spool 92 moves along the axial direction to switch the pressure of air supplied to each suction nozzle 56 between the negative pressure and the positive pressure.

Also, as illustrated in FIG. 6, each valve spool 92 includes, in an upper portion thereof, the substantially horizontal U-shaped contact portion 93 with which a V-axis cam follower 106 of a V-axis drive device 100 described below comes into contact. Each valve spool 92 is disposed, orienting an open side of the substantially U-shaped contact portion 93 outward (a side opposite to the shaft portion 62 side) (refer to FIG. 4). The contact portion 93 is formed in the substantially horizontal U shape to have a pair of opposed portions 93A spaced apart in the axial direction of the valve spool 92 (the Z-axis direction), extending in a direction orthogonal to the axial direction and facing each other.

An upper end of the valve spool 92 housed in the sleeve 94 moves to an upward end position (hereinafter referred to as the "negative pressure supply position 201") being a position indicated by a dot-and-dash line 201 in FIG. 6, and accordingly the negative pressure is supplied into the sleeve 94 in the switching device 90. Moreover, the upper end of the valve spool 92 moves to a downward end position (hereinafter referred to as the "positive pressure supply position 202") being a position indicated by a dot-and-dash line 202 in FIG. 6, and accordingly the positive pressure is supplied into the sleeve 94. The negative or positive pressure supplied into each sleeve 94 is supplied through an unillustrated supply path to the suction nozzle 56 corresponding to the sleeve 94.

Here, in the rotary head 50, the supply route for supplying the negative or positive pressure into each sleeve 94, and a negative or positive pressure supply mode are described. As illustrated in FIG. 6, each sleeve 94 is provided with a negative pressure input port 94A into which the negative pressure is inputted, a positive pressure input port 94B into which the positive pressure is inputted, and an output port (not illustrated) from which the negative or positive pressure inputted from the negative pressure input port 94A or the positive pressure input port 94B is outputted. The output port communicates with its corresponding suction nozzle 56.

Moreover, a first negative pressure supply path 62A through which the negative pressure is supplied is provided inside the inner shaft portion 62, and a first positive pressure supply path 62B through which the positive pressure is supplied is provided outside the rotating body 60 (refer to FIG. 2). A plurality of second negative pressure supply paths 64A through which the negative pressure is supplied, the plurality of second negative pressure supply paths 64A corresponding respectively to the sleeves 94, and two second positive pressure supply paths 64B through which the positive pressure is supplied, the two second positive pressure supply paths 64B communicating with the first positive pressure supply path 62B, are provided in the shaft holding portion 64.

The first negative pressure supply path 62A is configured in such a manner as to always communicate with all the second negative pressure supply paths 64A in a lower end portion of the first negative pressure supply path 62A irrespective of the rotation/non-rotation of the shaft portion 62. Moreover, each second negative pressure supply path 64A communicates with the negative pressure input port 94A of the sleeve 94 where the valve spool 92 is housed, while the valve spool 92 is in the negative pressure supply position 201. Therefore, while the valve spool 92 is in the negative pressure supply position 201, the negative pressure is always supplied to the suction nozzle 56 corresponding to the valve spool 92 (the switching device 90) irrespective of whether or not each suction nozzle 56 is rotating about the axis of the rotating body 60.

The two second positive pressure supply paths 64B are provided in the shaft holding portion 64, respectively in positions corresponding to the drive positions where each Z-axis drive device 80 raises and lowers the nozzle shaft 55 in the Z-axis direction. While the valve spool 92 corresponding to the suction nozzle 56 in the drive position is in the positive pressure supply position 202, both of the second positive pressure supply paths 64B communicate with the positive pressure input port 94B of the sleeve 94 where the valve spool 92 is housed. Therefore, while the valve spool 92 is in the positive pressure supply position 202, only when the suction nozzle 56 corresponding to the valve spool 92 is in the drive position, the positive pressure is supplied to the suction nozzle 56 from the output port.

As described above, in the rotary head 50, the negative pressure is always supplied to the suction nozzles 56 corresponding to the valve spools 92 in the negative pressure supply position 201. Accordingly, it is possible to prevent the electronic components E1 adhered to a plurality of the suction nozzles 56 from falling off during, for example, travel of the rotary head 50. Moreover, as described above, the positive pressure is supplied to the suction nozzle 56 corresponding to the valve spool 92 in the positive pressure supply position 202 only in the predetermined case. Accordingly, only the electronic component E1 targeted to be mounted can be mounted onto the printed board B1 by using the positive pressure.

As illustrated in FIG. 6, a plurality of outer seal rings 96 is disposed on an outer peripheral surface of each sleeve 94 and is spaced apart in the Z-axis direction. The outer seal ring 96 is an annular ring formed of an elastic body such as rubber, and achieves a function of sealing a gap between the sleeve 94 and the mounting hole of the shaft holding portion 64.

Moreover, unillustrated inner seal rings are disposed at a plurality of locations along the axial direction on an inner peripheral side of the sleeve 94. The inner seal ring is an annular ring formed of an elastic body such as rubber, and is attached to an outer surface of the valve spool 92. The inner seal ring achieves a function of sealing a gap between an inner peripheral surface of the sleeve 94 and the valve spool 92. As a result, the leaking of the negative pressure and the positive pressure between the negative pressure input port 94A, the positive pressure input port 94B, and the output port is prevented.

Moreover, the friction force of the inner seal ring holds, in the negative or positive pressure supply position, the valve spool 92 that has moved thereto. Moreover, the rotary head 50 includes two V-axis drive devices 100 (an example of valve drive units) for moving the valve spool 92 of each switching device 90 between the negative pressure supply position 201 and the positive pressure supply position 202 along the Z-axis direction (the up-and-down direction), as illustrated in FIGS. 2 to 4. The two V-axis drive devices 100 have the same structure as each other, and are symmetrically disposed on both of the left and right sides of the rotary head 50 with respect to the shaft portion 62 of the rotating body 60 (refer to FIG. 5).

Moreover, the two V-axis drive devices 100 are provided, corresponding respectively to the Z-axis drive devices 80, and are disposed immediately below their corresponding Z-axis drive devices 80 (refer to FIGS. 5 and 13). In other words, the V-axis drive device 100 and the Z-axis drive device 80 corresponding to the V-axis drive device 100 overlap each other when viewed from the direction of the rotation axis of the rotating body 60.

As illustrated in FIGS. 3 to 5, the V-axis drive device 100 includes a box-shaped V-axis drive source 102, and a V-axis moving portion 104 extending upward from the V-axis drive source 102. A V-axis linear motor 35V (refer to FIG. 7) for driving the V-axis moving portion 104 by linear motor drive is provided in the V-axis drive source 102. The V-axis moving portion 104 is supported in such a manner as to be movable with respect to the V-axis drive source 102 in a direction along the shaft portion 62, and is raised and lowered by the V-axis drive source 102 in the direction along the shaft portion 62. In the embodiment, the V-axis linear motor 35V is also an opposed moving magnet linear motor with a core.

As illustrated in FIGS. 4 and 5, the cam follower 106 (hereinafter referred to as the "V-axis cam follower 106") is attached to an upper end portion of the V-axis moving portion 104 of the V-axis drive device 100 in such a manner as to be rotatable about the axis along the X-axis direction. The V-axis moving portion 104 is supported by the V-axis drive source 102 in a placement where the V-axis cam follower 106 is located between the pair of opposed portions 93A of the contact portion of the valve spool corresponding to the nozzle shaft in the drive position.

When the V-axis drive source 102 moves the V-axis moving portion 104 up, the V-axis cam follower 106 comes into contact with the pair of opposed portions 93A located on both sides of the V-axis cam follower 106, presses the valve spool 92 upward, and raises the valve spool 92 to the negative pressure supply position 201. On the other hand, when the V-axis drive source 102 moves the V-axis moving portion 104 down, the V-axis cam follower 106 comes into contact with the pair of opposed portions 93A located on both sides of the V-axis cam follower 106, presses the valve spool 92 downward, and lowers the valve spool 92 to the positive pressure supply position 202.

Here, the rotation axis of the V-axis cam follower 106 is along the X-axis direction. Accordingly, the rotation direction of the V-axis cam follower 106 substantially agrees with a tangent direction of a trajectory drawing the circumference of the circle of each nozzle shaft 55 rotated by the rotating body 60. Hence, when the rotating body 60 is rotated during the raising and lowering operation of the valve spool 92 by the V-axis cam follower 106, the V-axis cam follower 106 is rotated by the friction force between the pair of opposed portions 93A while staying in contact with the pair of opposed portions 93A. Accordingly, the raising and lowering operation of the valve spool 92 can be performed while each nozzle shaft 55 is rotated.

Moreover, the V-axis cam follower 106 is designed not to be in contact with both of the opposed portions 93A of the valve spool 92 while the valve spool 92 is located close to a height position at the midpoint between the negative pressure supply position 201 and the positive pressure supply position 202. Hence, the V-axis moving portion 104 can rotate the rotating body 60 without the V-axis cam follower 106 interfering with the valve spool 92, while the valve spool 92 is close to the height position at the midpoint between the negative pressure supply position 201 and the positive pressure supply position 202.

Figure 7:
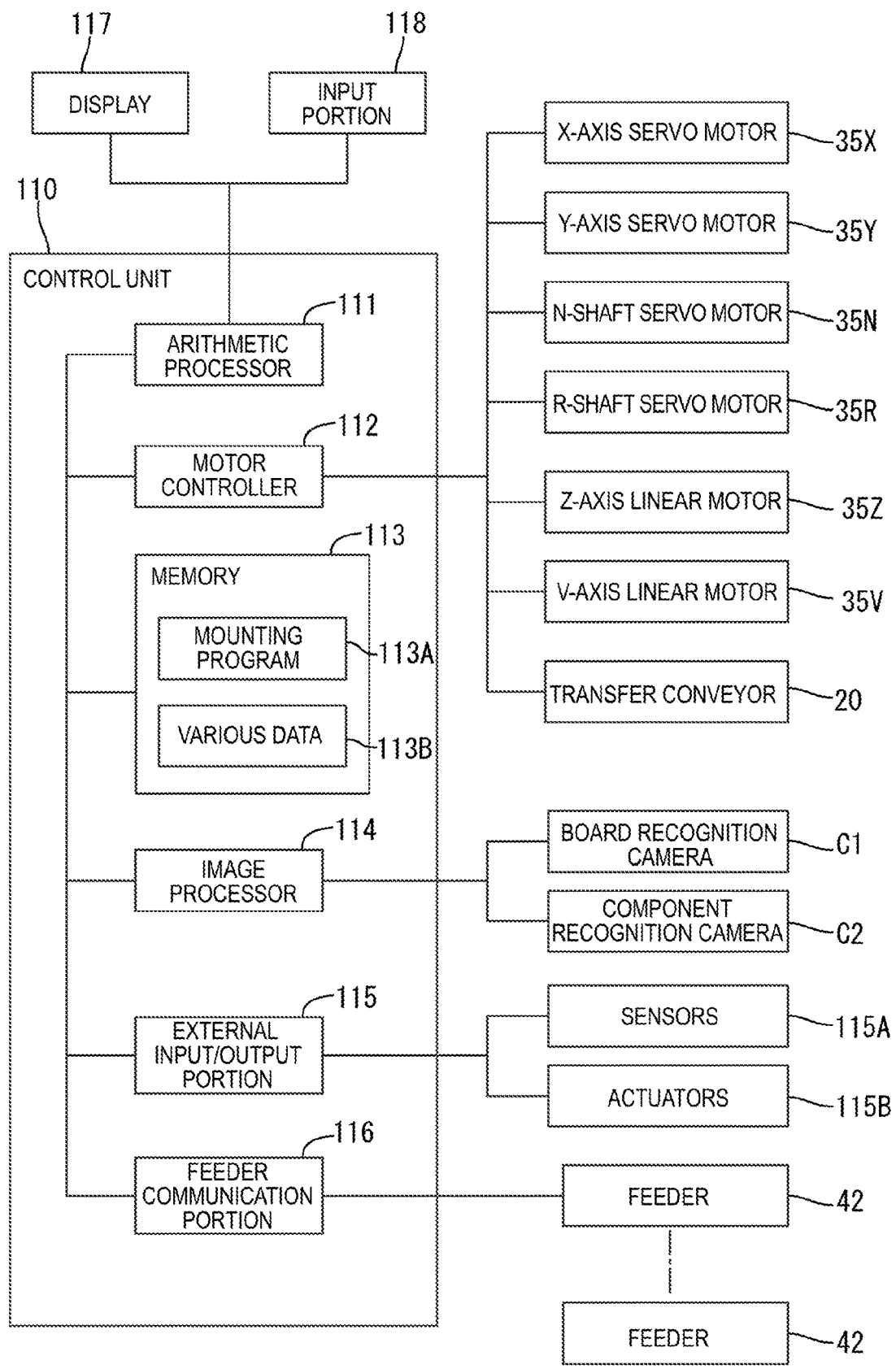
FIG. 7 is a block diagram illustrating an electrical configuration of the surface mounter.

The rotary head 50 is provided with a board recognition camera C1 (refer to FIG. 7). The board recognition camera C1 moves integrally with the rotary head 50 to capture an image in any position on the printed board B1 that has stopped in the operation position. Moreover, a component recognition camera C2 (refer to FIG. 1) is fixed close to the operation position on the base 10. The component recognition camera C2 captures an image of the electronic component E1 adhered by the suction nozzle 56 in the component supply position of the component feeding device 40.

(3) Electrical Configuration of Surface-Mount Placement Machine

Next, the electrical configuration of the surface mounter 1 is described with reference to FIG. 7. A control unit 110 integrally controls the entire main body of the surface mounter 1. The control unit 110 includes an operation control unit 111 configured of, for example, a CPU. The operation control unit 111 is connected to a motor controller 112, a memory 113, an image processor 114, an external input/output portion 115, a feeder communication portion 116, a display 117, and an input portion 118.

In accordance with a mounting program 113A described below, the motor controller 112 drives the X-axis servo motor 35X and the Y-axis servo motor 35Y of the component mounting device 30, and drives the N-shaft servo motor 35N, the R-shaft servo motor 35R, the Z-axis linear motor 35Z, and the V-axis linear motor 35V of the rotary head 50. Moreover, the motor controller 112 drives the transfer conveyor 20 in accordance with the mounting program 113A.

The memory 113 is configured including a ROM (Read Only Memory) where, for example, a program that controls the CPU is stored, and a RAM (Random Access Memory) where various pieces of data are temporarily stored during the operation of the device. The mounting program 113A and various pieces of data 113B, which are described below, are stored in the memory 113.

Specifically, the mounting program 113A stored in the memory 113 includes board information related to the number of the printed boards B1 manufactured and targeted for mounting, component information including the number and types of the electronic components E1 to be mounted onto the printed board B1, and mounting information related to positions where the electronic components E1 are mounted on the printed board B1. The various pieces of data 113B stored in the memory 113 include data related to the number and type of the electronic components E1 held by each feeder 42 of the component feeding device 40.

The image processor 114 is designed to capture imaging signals outputted from the board recognition camera C1 and the component recognition camera C2. The image processor 114 is designed to carry out an analysis of a component image and an analysis of a board image, respectively, on the basis of the imaging signals captured by the cameras C1 and C2.

The external input/output portion 115 is what is called an interface, and is configured in such a manner as to capture detection signals outputted from a group of various sensors 115A provided to the main body of the surface mounter 1. Moreover, the external input/output portion 115 is configured in such a manner as to control operation over a group of various actuators 115B on the basis of control signals outputted from the arithmetic processor 111.

The feeder communication portion 116 is connected to a control unit of each feeder 42 attached to the component feeding device 40, and integrally controls each feeder 42. The control unit of each feeder 42 controls the drive of a motor for delivering the component supply tape.

The display 117 is configured including a liquid crystal display device with a display screen, and displays, for example, the state of the surface mounter 1 on the display screen. The input portion 118 is configured including a keyboard, and is designed to accept an input from the outside by a manual operation.

In the surface mounter 1 configured as described above, a transfer state where the transfer conveyor 20 performs the operation of transferring the printed board B1, and a mounting state where the operation of placing the electronic components E1 onto the printed board B1 carried in to the operation position on the base 10 is performed are alternately executed during automatic operation.

(4) Drive Mechanism of Linear Motor Drive in Z-Axis Drive Device

Next, a drive mechanism of linear motor drive in the Z-axis drive device 80 is described with reference to FIGS. 8 to 10.

Figure 8:
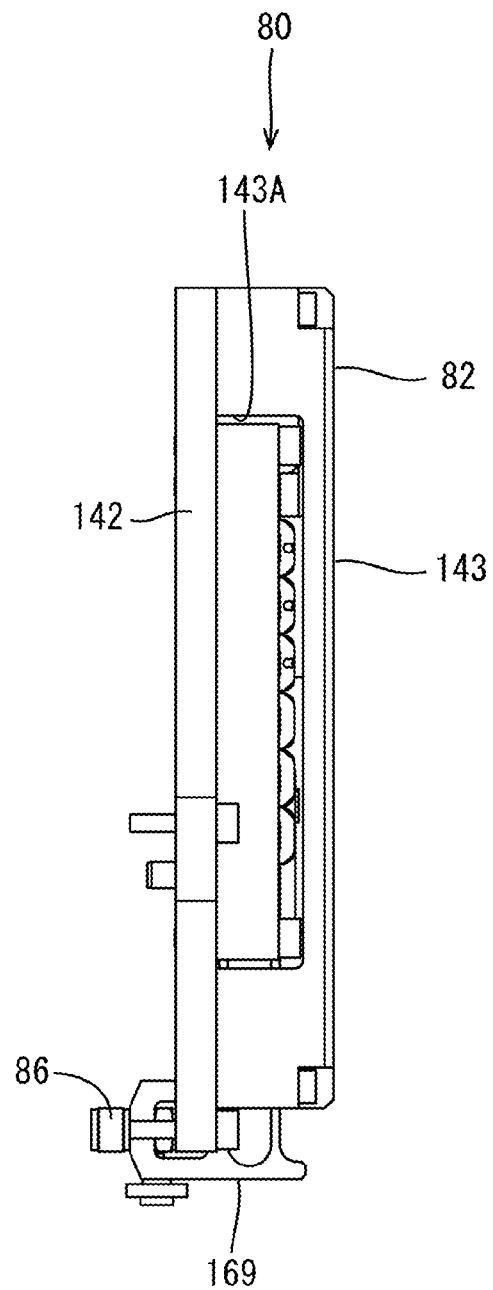
FIG. 8 is a front view of a Z-axis drive device.

As illustrated in FIG. 8, the box-shaped Z-axis drive source 82 includes a plate-shaped Z-axis main body portion 142 provided with a drive mechanism by linear motor drive, and a Z-axis cover 143 that is attached to the Z-axis main body portion 142 to protect the drive mechanism from the outside. The Z-axis cover 143 does not cover the Z-axis main body portion 142 completely, and is provided at the front with a cooling opening 143A for preventing heat from becoming trapped in the Z-axis drive source 82.

Figure 9:
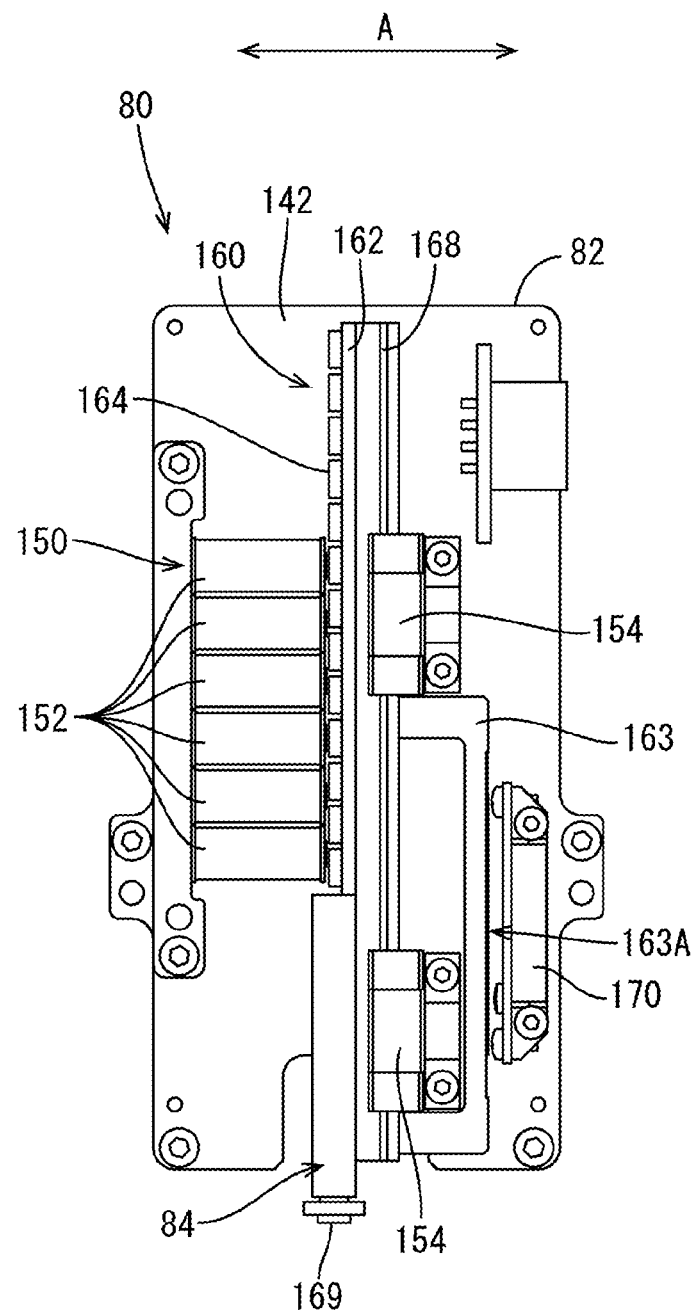
FIG. 9 is a side view illustrating the inside of a Z-axis drive source.

As illustrated in FIG. 9, in the Z-axis drive device 80, the Z-axis drive source 82 is provided with a stator 150 of the linear motor, and the Z-axis moving portion 84 is provided with a mover 160 of the linear motor. The Z-axis drive source 82 is provided on the plate surface of the Z-axis main body portion 142 with the stator 150 including six armature coils 152 arranged side by side along a travel direction of the Z-axis moving portion 84 (the Z-axis direction and the up-and-down direction), and two rail guides 154 extending along the travel direction of the Z-axis moving portion 84.

The stator 150 is provided on the front side (the left side in FIG. 9) of the Z-axis drive source 82. The rail guide 154 is provided on the rear side of the Z-axis drive source 82, and is provided on an inner side thereof with a rail groove (not illustrated) extending along an extension direction of the rail guide 154.

On the other hand, as illustrated in FIG. 9, the Z-axis moving portion 84 includes a thick plate-shaped yoke 162

(an example of output shaft) orienting both plate surfaces in the front-and-rear direction and extending in the Z-axis direction, the mover 160 provided on the front surface of the yoke 162 and including a plurality of permanent magnets 164 (the reference numeral of them, apart from one, is omitted in FIG. 9), a rail 168 provided on the rear surface of the yoke 162, and a cam follower support portion 169 attached to a lower end portion of the yoke 162.

The yoke 162 is provided, at a lower end portion on a side opposite to the stator 150 across the yoke 162, with a first to-be-read member 163 extending substantially parallel to the yoke 162. As illustrated in FIG. 9, in the embodiment, the first to-be-read member 163 is formed in a U shape having a portion extending substantially parallel to the yoke 162. An unillustrated scale for optically detecting the vertical position of the yoke 162, that is, the vertical position of the mover 160 is marked on a surface 163A, which faces the rear side, of the first to-be-read member 163.

The plurality of permanent magnets 164 configuring the mover 160 is arranged side by side in a straight line at regular intervals such that different magnetic poles are alternately arranged. Here, in FIG. 9, a direction A indicates the direction in which the stator 150 and the mover 160 are arranged.

The rail 168 is provided in a groove form along an extension direction of the yoke 162, and is fitted to the rail guide 154 via a plurality of balls provided in the groove in such a manner as to be movable along the extension direction of the yoke 162 (the travel direction of the Z-axis moving portion 84, the Z-axis direction, and the up-and-down direction). The cam follower support portion 169 is provided to the lower end portion of the yoke 162, and supports the Z-axis cam follower 86 rotatably. When the yoke 162 moves, the cam follower support portion 169 and the Z-axis cam follower 86 move together with the yoke 162.

An encoder unit 170 (an example of a first position detection unit) faces the first to-be-read member 163 provided to the yoke 162 from the rear side. The encoder unit 170 optically reads the scale marked on the surface 163A, which faces the rear side, of the first to-be-read member 163 to detect the vertical position of the mover 160.

In the Z-axis drive device 80, the Z-axis drive source 82 and the Z-axis moving portion 84 are configured as described above. Accordingly, when the armature coils 152 of the stator 150 are energized, the propulsive force of the linear motor drive, acts between the stator 150 and the mover 160. The propulsive force moves the Z-axis moving portion 84 in the Z-axis direction (the up-and-down direction). The stator 150 and the mover 160 apply such propulsive force. The stator 150 and the mover 160 are set as the Z-axis linear motor 35Z and controlled by the control unit 110.

Figure 10:
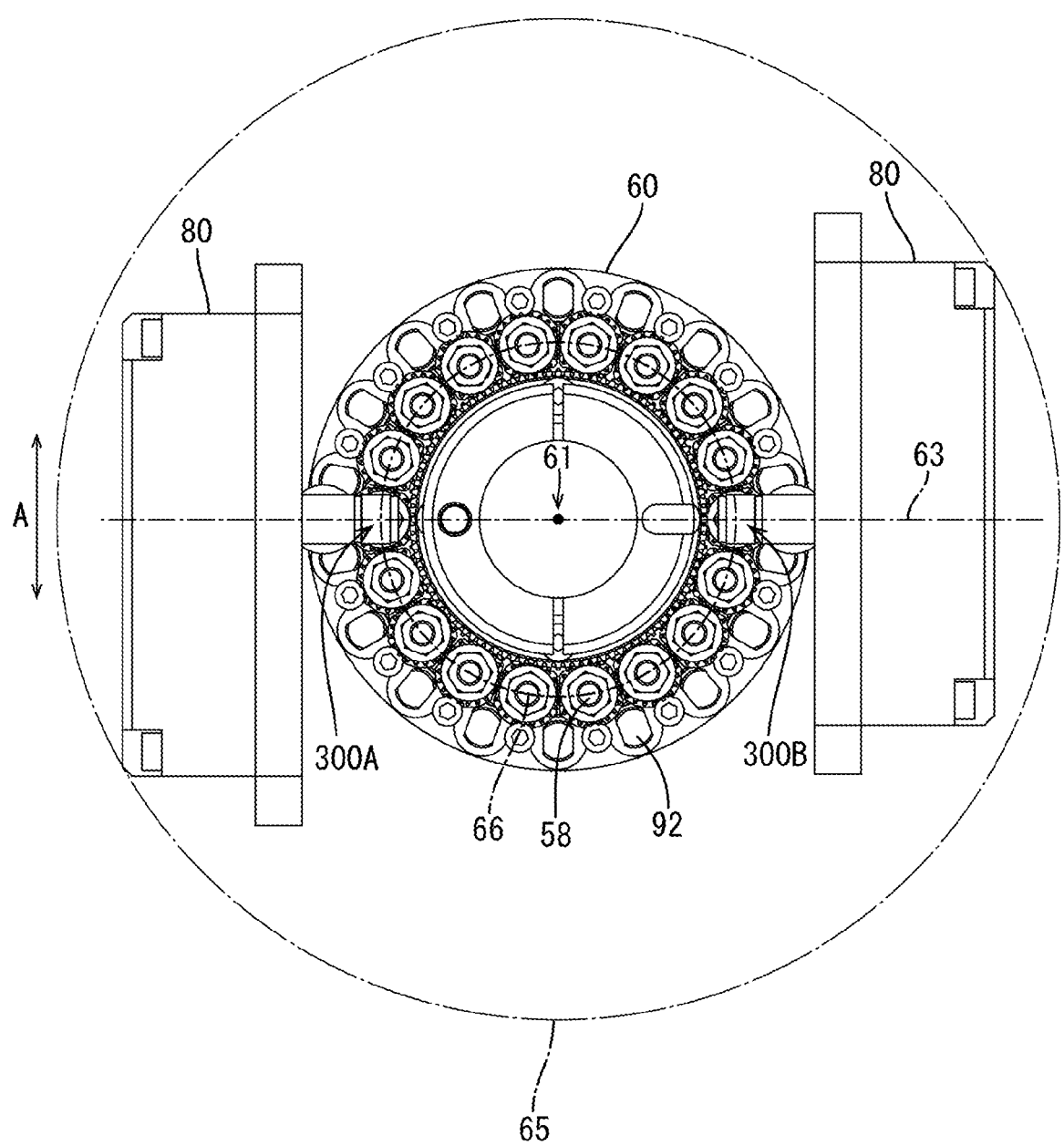
FIG. 10 is a top view of a rotating body and the Z-axis drive device.

Next, the placement of the two Z-axis drive devices 80 is described more specifically with reference to FIG. 10. Here, a point 61 indicates the rotation axis of the rotating body 60 in FIG. 10. Moreover, the circle 66 indicated by a dotted line in FIG. 10 indicates the virtual circle where the suction nozzles 56 are arranged. Moreover, each of two positions 300A and 300B illustrated in FIG. 10 indicates a drive position where the Z-axis drive device 80 drives the nozzle shaft 55 (that is, the suction nozzle 56). As described above, the two Z-axis drive devices 80 have the same structure as each other, and are disposed in such a manner as to be point-symmetric about the rotation axis 61 of the rotating body 60 when viewed from the direction of the rotation axis 61. In other words, one of the Z-axis drive devices 80 is disposed in a form where the other of the Z-axis drive devices 80 has been rotated 180 degrees about the rotation axis 61.

As illustrated in FIG. 10, the Z-axis drive devices 80 are disposed around the rotating body 60 when viewed from the direction of the rotation axis 61 of the rotating body 60. The Z-axis drive devices 80 are disposed on a virtual straight line 63 orthogonal to the rotation axis 61 in an orientation where the mover 16 moves in the direction of the rotation axis 61, and in an orientation where the stator 150 and the mover 160 are arranged in a tangent direction (the direction A illustrated in FIGS. 9 and 10) to the virtual circle 66 at a point of intersection of the virtual circle 66 where the suction nozzles 56 are arranged and the virtual straight line 63.

(5) Drive Mechanism of Linear Motor Drive in V-Axis Drive Device

Next, a drive mechanism of linear motor drive in the V-axis drive device 100 is described with reference to FIGS. 11 to 13.

Figure 11:
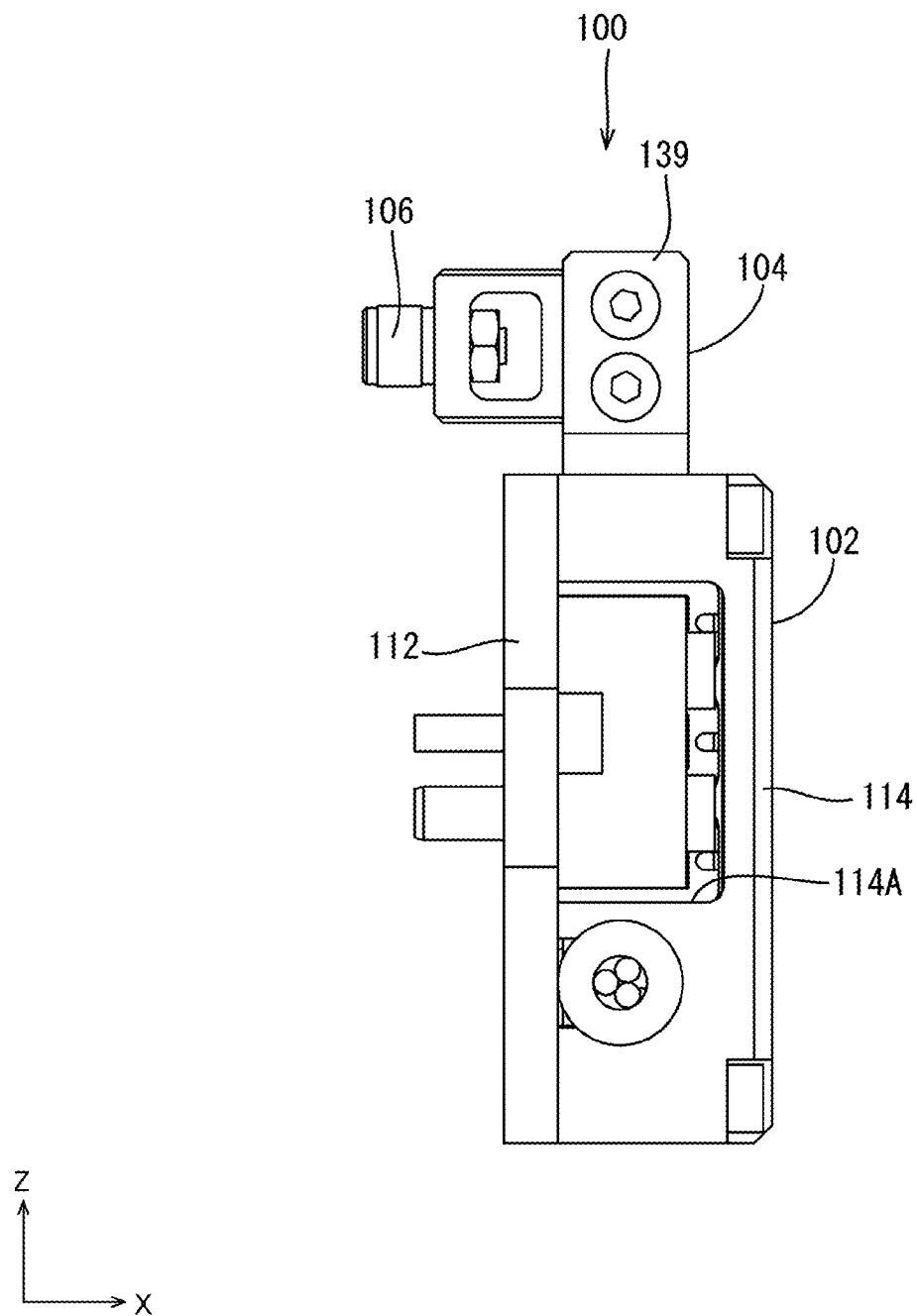
FIG. 11 is a front view of a V-axis drive device.

As illustrated in FIG. 11, the box-shaped V-axis drive source 102 includes a plate-shaped V-axis main body portion 112 provided with a drive mechanism of linear motor drive, and a V-axis cover 114 attached to the V-axis main body portion 112 to protect the drive mechanism from the outside. The V-axis cover 114 does not cover the V-axis main body portion 112 completely, and is provided at the front with a cooling opening 114A for preventing heat from becoming trapped in the V-axis drive source 102.

Figure 12:
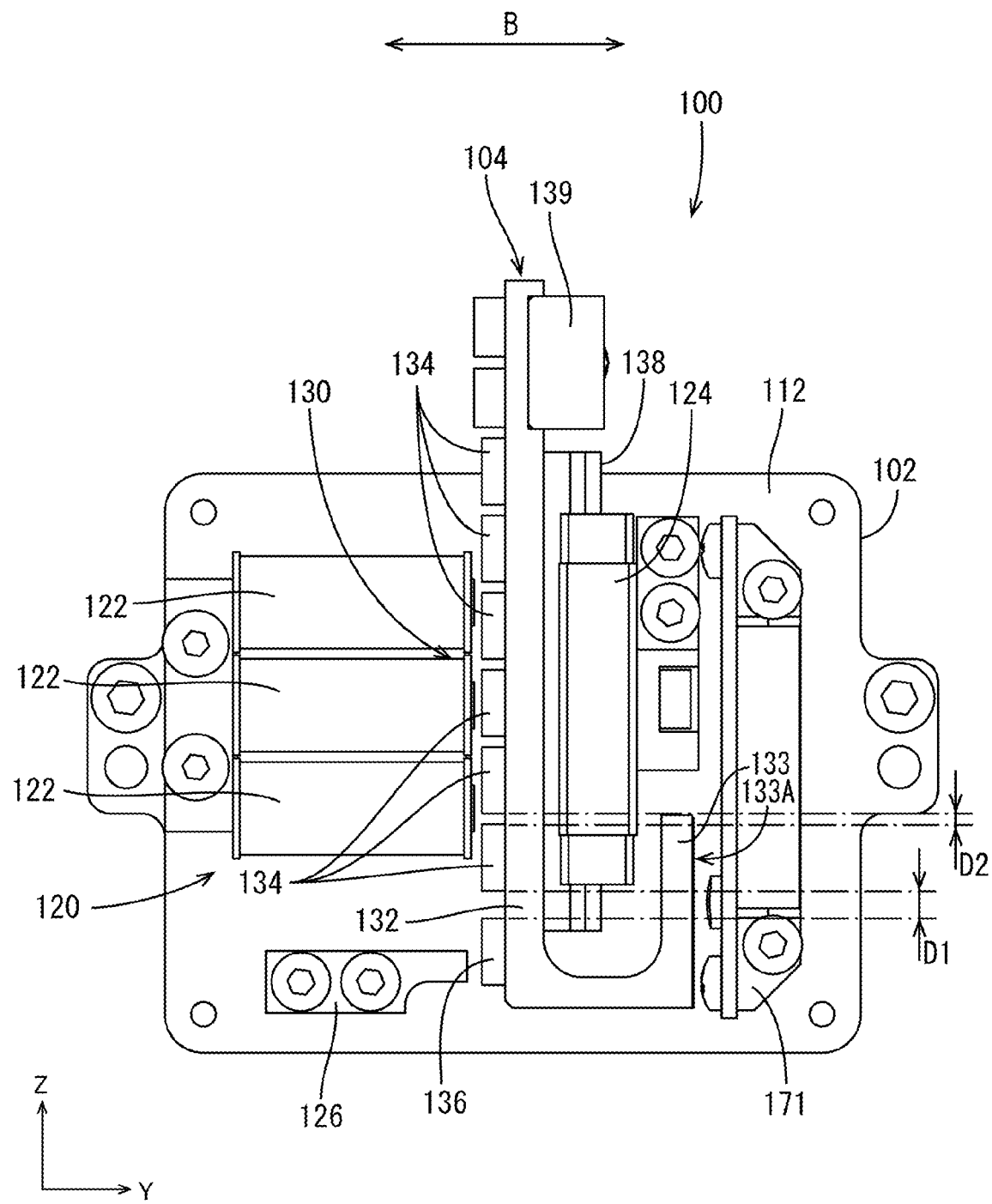
FIG. 12 is a side view illustrating the inside of a V-axis drive source.

As illustrated in FIG. 12, in the V-axis drive device 100, the V-axis drive source 102 is provided with a stator 120 of a linear motor, and the V-axis moving portion 104 is provided with a mover 130 of the linear motor. The V-axis drive source 102 is provided on the plate surface of the V-axis main body portion 112 with the stator 120 including three armature coils 122 arranged side by side along a travel direction of the V-axis moving portion 104 (the Z-axis direction and the up-and-down direction), a rail guide 124 extending along the travel direction of the V-axis moving portion 104, and an iron piece (an example of a magnetic substance) 126.

The stator 120 is provided on the front side (the left side in FIG. 12) of the V-axis drive source 102. The rail guide 124 is provided on the rear side of the V-axis drive source 102. The rail guide 124 is provided on an inner side thereof with a rail groove (not illustrated) extending along an extension direction of the rail guide 124. The iron piece 126 is provided below the stator 120, spaced a predetermined distance from the stator 120.

On the other hand, as illustrated in FIG. 12, the V-axis moving portion 104 includes a thick plate-shaped yoke 132 (an example of output shaft) orienting both plate surfaces in the front-and-rear direction and extending in a travel direction of the V-axis drive source 102, the mover 130 provided on the front surface of the yoke 132 and having a plurality of permanent magnets 134, a position holding magnet 136 provided on the front surface of the yoke 132 and having one permanent magnet, a rail guide 138 provided on the rear surface of the yoke 132, and a cam follower support portion 139 attached to an upper end portion of the yoke 132.

A lower end portion of the yoke 132 is folded to a side opposite to the stator 120 to be provided integrally with a second to-be-read member 133. An unillustrated scale for optically detecting the vertical position of the yoke 132, that is, the vertical position of the mover 130 is marked on a surface 133A, which faces the rear side, of the second to-be-read member 133.

The plurality of permanent magnets 134 configuring the mover 130 is arranged side by side in a straight line at regular intervals such that different magnetic poles are alternately arranged. Here, in FIG. 12, a direction B indicates the direction in which the stator 120 and the mover 130 are arranged.

The position holding magnet 136 is provided on the front surface of a lower end portion of the yoke 132 and below the plurality of permanent magnets 134 configuring the mover 130. The surface of the plurality of permanent magnets 134 and the surface of the position holding magnet 136 are located on the same plane.

The rail 138 is provided in a groove form along an extension direction of the yoke 132, and is fitted to the rail guide 124 in such a manner as to be movable along the extension direction of the yoke 132 (the travel direction of the V-axis moving portion 104, the Z-axis direction, and the up-and-down direction). The cam follower support portion 139 is provided to the upper end portion of the yoke 132 to rotatably support the V-axis cam follower 106. When the yoke 132 moves, the cam follower support portion 139 and the V-axis cam follower 106 move together with the yoke 132.

An encoder unit 171 (an example of a second position detection unit) faces the second to-be-read member 133, which is the folded portion of the yoke 132, from the rear side. The encoder unit 171 optically reads the scale marked on the surface 133A, which faces the rear side, of the second to-be-read member 133 to detect the vertical position of the mover 130.

In the V-axis drive device 100, the rail guide 124 of the V-axis moving portion 104 is fitted to the rail guide 138 while the plurality of permanent magnets 134 and the stator 120, and the position holding magnet 136 and the iron piece 126 are close to each other. The distance between the plurality of permanent magnets 134 and the stator 120 is substantially equal to the distance between the position holding magnet 136 and the iron piece 126. On the other hand, as illustrated in FIG. 12, a distance D1 between the position holding magnet 136 and the plurality of permanent magnets 134 configuring the mover 130 is set larger than a distance D2 between the permanent magnets 134 included in the mover 130.

In the V-axis drive device 100, the V-axis drive source 102 and the V-axis moving portion 104 are configured as described above. Accordingly, when the armature coils 122 of the stator 120 are energized, the propulsive force of the linear motor drive acts between the stator 120 and the mover 130. The propulsive force moves the V-axis moving portion 104 in the Z-axis direction (the up-and-down direction). The stator 120 and the mover 130, which apply such propulsive force, are set as the V-axis linear motor 35V, and are controlled by the control unit 110.

On the other hand, in the V-axis drive device 100, when the energization of the armature coils 122 of the stator 120 is stopped, a magnetic force acting between the position holding magnet 136 and the iron piece 126 holds the V-axis moving portion 104 in a height position in the Z-axis direction (the up-and-down direction) at the midpoint between the position where the valve spool 92 is in the negative pressure supply position 201 and the position where the valve spool 92 is in the positive pressure supply position 202. In other words, the position holding magnet 136 and the iron piece 126 function as what is called a magnetic spring.

The magnetic force of the plurality of permanent magnets 134 configuring the mover 130 is set larger than the magnetic force of the position holding magnet 136. It is configured such that the position holding magnet 136 does not influence the travel of the V-axis drive source 102 by the linear motor drive.

Figure 13:
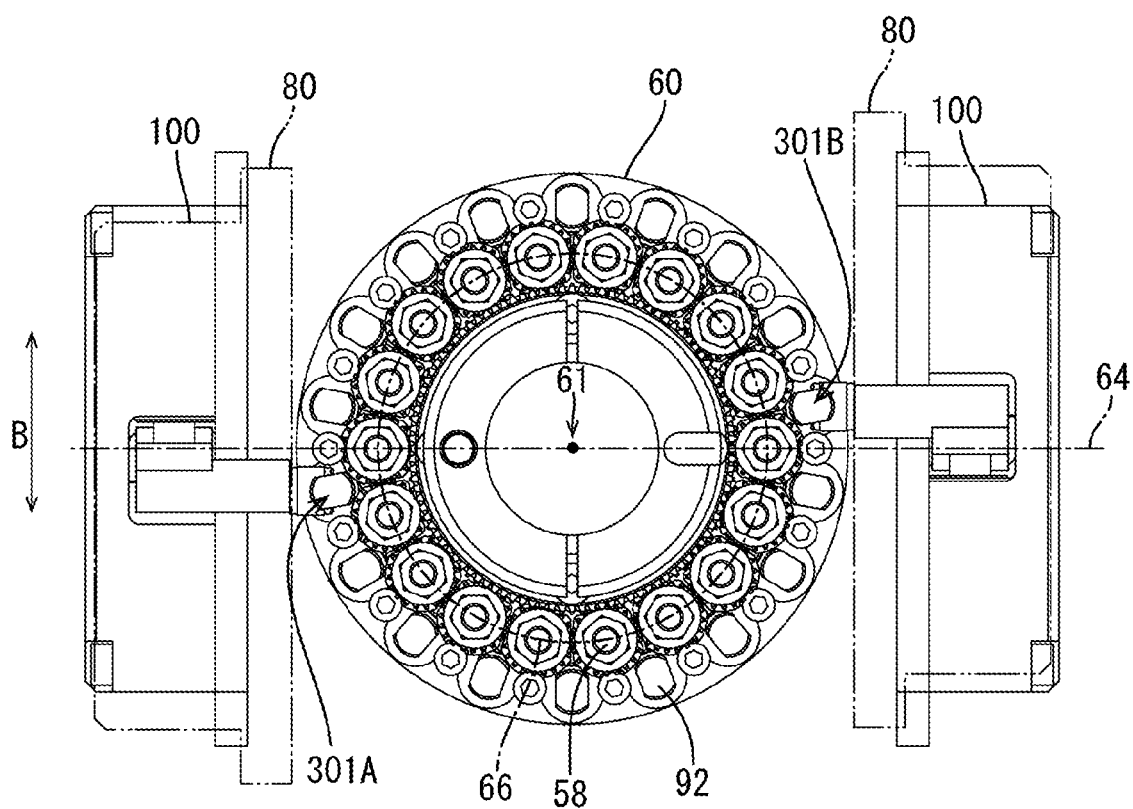
FIG. 13 is a top view of the rotating body and the V-axis drive device.

Next, the placement of the two V-axis drive devices 100 is described more specifically with reference to FIG. 13. Here, the point 61 indicates the rotation axis of the rotating body 60 in FIG. 13. Each of two positions 301A and 301B illustrated in FIG. 13 indicates the drive position where the V-axis drive device 100 drives the valve spool 92 (that is, the valve). As described above, the two V-axis drive devices 100 have the same structure as each other, and are disposed in such a manner as to be point-symmetric about the rotation axis 61 of the rotating body 60. In other words, one of the V-axis drive devices 100 is disposed in the form where the other of the V-axis drive devices 100 has been rotated 180 degrees about the rotation axis 61.

As illustrated in FIG. 13, the V-axis drive devices 100 are disposed around the rotating body 60 when viewed from the direction of the rotation axis 61 of the rotating body 60. The V-axis drive devices 100 are disposed on a virtual straight line 64 orthogonal to the rotation axis 61 in an orientation where the mover 130 moves in the direction of the rotation axis 61, and in an orientation where the stator 120 and the mover 130 are arranged in a tangent direction (the direction B illustrated in FIGS. 12 and 13) to the virtual circle 66 at a point of intersection of the virtual circle 66 where the suction nozzles 56 are arranged and the virtual straight line 64.

(6) Effects of Embodiment

According to the rotary head 50 of the embodiment described above, the Z-axis drive device 80 includes the opposed linear motor with the core as the drive source. The opposed linear motor with the core has a higher thrust density than the linear shaft motor. Accordingly, when the motor is of the same size, even if its operating load is increased, heat is unlikely to be generated. Hence, according to the rotary head 50, it is possible to prevent a reduction in the precision of placement due to heat generated by the linear motor.

Furthermore, according to the rotary head 50, the Z-axis drive device 80 is disposed around the rotating body 60 in the orientation where the mover 160 moves in the direction of the rotation axis 61. Accordingly, it is possible to prevent the Z-axis drive device 80 from extending out in a direction of the virtual straight line 63 as compared to, for example, a case where the Z-axis drive device 80 is disposed in an orientation where the mover 160 moves in the direction of the virtual straight line 63. Furthermore, according to the rotary head 50, the Z-axis drive device 80 is disposed on any virtual straight line (in the embodiment the virtual straight line 63) orthogonal to the rotation axis 61 of the rotating body 60 in the orientation where the stator 150 and the mover 160 are arranged in the tangent direction to the virtual circle 66 at the point of intersection of the virtual circle 66 and the virtual straight line 63. Accordingly, it is possible to further prevent the Z-axis drive device 80 from extending out in the direction of the virtual straight line 63 as compared to a case where the Z-axis drive device 80 is disposed in an orientation where the stator 150 and the mover 160 are inclined against the tangent direction (for example, a case where the Z-axis drive device 80 is disposed in an orientation where the stator 150 and the mover 160 are arranged in the direction of the virtual straight line 63).

In this manner, according to the rotary head 50, it is possible to prevent the Z-axis drive device 80 from extending out. Accordingly, as illustrated in FIG. 10, a circle (outermost circle) 65 circumscribing the Z-axis drive device 80 with the rotation axis 61 of the rotating body 60 as the center can be reduced. In other words, the rotary head 50 can be made compact when viewed from the direction of the rotation axis 61 of the rotating body 60. Consequently, it is possible to cause the rotary head 50 to have a large range of motion in a direction perpendicular to the rotation axis 61 of the rotating body 60.

Furthermore, according to the rotary head 50, the first to-be-read member 163 extending substantially parallel to the yoke 162 is provided to the yoke 162 (an example of the output shaft) on the side opposite to the stator 150 across the yoke 162. For example, the yoke 162 is formed in a straight shape extending straight in the direction of the rotation axis 61 of the rotating body 60, and the extension portion is used as the to-be-read member. Accordingly, it is also possible to dispose the stator 150 and the encoder unit 170, side by side, in the direction of the rotation axis 61. However, in this case, the yoke 162 is increased in length in the direction of the rotation axis 61. Accordingly, it may be difficult to secure a space for disposing the Z-axis drive device 80.

Contrarily, according to the rotary head 50, the first to-be-read member 163 extending substantially parallel to the yoke 162 is provided on the side opposite to the stator 150 across the yoke 162. Accordingly, the length of the yoke 162 in the direction of the rotation axis 61 can be reduced. Consequently, it is easy to secure the space for disposing the Z-axis drive device 80, even if it is difficult to secure the space for disposing the Z-axis drive device 80 when the yoke 162 is long in the direction of the rotation axis 61.

Furthermore, according to the rotary head 50, the V-axis drive device 100 includes the opposed linear motor with the core as the drive source, and accordingly is unlikely to generate heat even if a high operating load is applied thereto. Hence, according to the rotary head 50, it is possible to prevent a reduction in the precision of placement due to heat generated by the linear motor.

Furthermore, according to the rotary head 50, the V-axis drive device 100 is disposed around the rotating body 60 on the virtual straight line 64 orthogonal to the rotation axis 61 in the orientation where the mover 130 moves in the direction of the rotation axis 61, and in the orientation where the stator 120 and the mover 130 are arranged in the tangent direction (the direction B illustrated in FIGS. 12 and 13) to the virtual circle 66 at the point of intersection of the virtual circle 66 and the virtual straight line 64. Accordingly, the rotary head 50 can be made compact when viewed from the direction of the rotation axis 61 of the rotating body 60. Consequently, it is possible to cause the rotary head 50 to have a large range of motion in the direction perpendicular to the rotation axis 61 of the rotating body 60.

Furthermore, according to the rotary head 50, the Z-axis drive device 80 and the V-axis drive device 100 overlap each other when viewed from the direction of the rotation axis 61 of the rotating body 60. If the Z-axis drive device 80 and the V-axis drive device 100 extend out in different directions when viewed from the direction of the rotation axis 61 of the rotating body 60, the rotary head 50 results in being increased in size when viewed from the direction of the rotation axis 61 of the rotating body 60.

Contrarily, according to the rotary head 50, the Z-axis drive device 80 and the V-axis drive device 100 overlap each other when viewed from the direction of the rotation axis 61 of the rotating body 60. Accordingly, the direction in which the Z-axis drive device 80 extends out is substantially the same as the direction in which the V-axis drive device 100 extends out. Hence, the rotary head 50 can be reduced in size when viewed from the direction of the rotation axis 61 as compared to the case where they extend out in directions different from each other. Consequently, it is possible to cause the rotary head 50 to have a large range of motion in the direction perpendicular to the rotation axis 61.

Furthermore, according to the rotary head 50, the second to-be-read member 133 extending substantially parallel to the yoke 132 (an example of the output shaft) is provided to the yoke 132 on the side opposite to the stator 120 across the yoke 132. Accordingly, it is easy to secure a space for disposing the V-axis drive device 100, even if it is difficult to secure the space for disposing the V-axis drive device 100 when the yoke 132 is long in the direction of the rotation axis 61.

OTHER EMBODIMENTS

The technology disclosed in the description is not limited to the embodiment described above with the drawings, and includes, for example, the following embodiments in the technical scope.

(1) In the above embodiment, the description has been given taking, as an example, the case where two Z-axis drive devices 80 and two V-axis drive devices 100 are included. However, these numbers are not limited to two, and may be three or more.

(2) In the above embodiment, the description has been given, taking, as an example, the case where two Z-axis drive devices 80 are included, and are disposed in such a manner as to be point-symmetric about the rotation axis 61 of the rotating body 60 when viewed from the direction of the rotation axis 61. Contrarily, the two Z-axis drive devices 80 may not be necessarily disposed in such a manner as to be point-symmetric.

(3) In the above embodiment, the description has been given, taking, as an example, the case where two pairs of the Z-axis drive device 80 and the V-axis drive device 100 are included, and in both pairs, the V-axis drive device 100 is located immediately below the Z-axis drive device 80 corresponding to the V-axis drive device 100 (the Z-axis drive device 80 and the V-axis drive device 100 corresponding to the Z-axis drive device 80 overlap each other when viewed from the direction of the rotation axis 61 of the rotating body 60). Contrarily, in both pairs, the V-axis drive device 100 may not be located immediately below the Z-axis drive device 80, or only in one of the pairs, the V-axis drive device 100 may be located immediately below the Z-axis drive device 80.

(4) In the above embodiment, the description has been given, taking, as an example, the case where the Z-axis drive device 80 includes the opposed linear motor with the core. However, if the V-axis drive device 100 includes the opposed linear motor with the core, the Z-axis drive device 80 may not include the opposed linear motor with the core. For example, if the V-axis drive device 100 includes the opposed linear motor with the core, the Z-axis drive device 80 may move the suction valve 56 by a linear motor other than the opposed linear motor with the core, or by a rotary motor.

(5) In the above embodiment, the description has been given, taking, as an example, the case where the V-axis drive device 100 includes the opposed linear motor with the core. However, if the Z-axis drive device 80 includes the opposed linear motor with the core, the V-axis drive device 100 may not include the opposed linear motor with the core. For example, if the Z-axis drive device 80 includes the opposed linear motor with the core, the V-axis drive device 100 may move the suction valve 56 by a linear motor other than the opposed linear motor with the core, by a rotary motor, by a solenoid valve, or by pneumatic pressure.

(6) In the above embodiment, the description has been given, taking the suction nozzle as the component holding member as an example. However, the component holding member is not limited to the suction nozzle. For example, the component holding member may be what is called a chuck that sandwiches and holds a component between two claws.

What is claimed is:

1. A rotary head of a surface mounter, comprising:
a rotating body;
a rotation drive configured to rotate and drive the rotating body;
a plurality of component holding members attached to the rotating body in such a manner as to be movable in a direction of a rotation axis, the plurality of component holding members being arranged on a virtual circle with the rotation axis as the center, the plurality of component holding members being configured to hold and release a component; and
at least two holding member drives including an opposed linear motor with a core, the holding member drive being configured to use the opposed linear motor with the core to move, in the direction of the rotation axis, the component holding member that has moved to a predetermined drive position on the virtual circle,
the at least two holding member drives having the same structure as each other,
one of the at least two holding member drives being disposed in a form where the other of the at least two holding member drives having been rotated 180 degrees about the rotation axis so that the at least two holding member drives are disposed in such a manner as to be point-symmetric about the rotation axis when viewed from the direction of the rotation axis, and
each of the holding member drives being disposed around the rotating body on any virtual straight line orthogonal to the rotation axis in an orientation where a mover of the opposed linear motor with the core of the holding member drive moves in the direction of the rotation axis, and in an orientation where a stator and the mover of the opposed linear motor with the core are arranged in a tangent direction to the virtual circle at a point of intersection of the virtual circle and the virtual straight line.

2. The rotary head according to claim 1, further comprising:
a first to-be-read member provided on an output shaft to which the mover of the opposed linear motor with the core is attached, the first to-be-read member extending substantially parallel to the output shaft on a side opposite to the stator of the opposed linear motor with the core across the output shaft; and
a first position detector disposed on the side opposite to the output shaft across the first to-be-read member and configured to detect a position of the first to-be-read member.

3. A rotary head of a surface mounter, comprising:
a rotating body;
a rotation drive configured to rotate and drive the rotating body;
a plurality of component holding members attached to the rotating body in such a manner as to be movable in a direction of a rotation axis, the plurality of component holding members being arranged on a virtual circle with the rotation axis as the center, the plurality of component holding members being configured to hold and release a component, each of the component holding members being a suction nozzle that causes the component to adhere thereto by using negative pressure and releases the adhering component by using positive pressure;
a holding member drive including an opposed linear motor with a core, the holding member drive being configured to use the opposed linear motor with the core to move, in the direction of the rotation axis, the component holding member that has moved to a predetermined drive position on the virtual circle;
a plurality of valves attached to the rotating body in such a manner as to be movable between a negative pressure supply position that supplies the negative pressure to the suction nozzle and a positive pressure supply position that supplies the positive pressure to the suction nozzle; and
a valve drive including an opposed linear motor with a core, the valve drive being configured to use the opposed linear motor with the core to move the valve corresponding to the suction nozzle that has moved to the drive position, between the negative pressure supply position and the positive pressure supply position.

4. The rotary head according to claim 3, wherein the valve drive is disposed around the rotating body on any virtual straight line orthogonal to the rotation axis in an orientation where a mover of the opposed linear motor with the core of the valve drive moves in the direction of the rotation axis, and in an orientation where a stator and the mover of the opposed linear motor with the core are arranged in a tangent direction to the virtual circle at a point of intersection of the virtual circle and the virtual straight line.

5. The rotary head according to claim 4, wherein the holding member drive and the valve drive overlap each other when viewed from the direction of the rotation axis.

6. The rotary head according to claim 5, further comprising:
a second to-be-read member provided on an output shaft to which the mover of the opposed linear motor with the core of the valve drive is attached, the second to-be-read member extending substantially parallel to the output shaft on a side opposite to the stator of the opposed linear motor with the core across the output shaft; and
a second position detector disposed on the side opposite to the output shaft across the second to-be-read member and configured to detect a position of the second to-be-read member.

7. The rotary head according to claim 4, further comprising:
a second to-be-read member provided on an output shaft to which the mover of the opposed linear motor with the core of the valve drive is attached, the second to-be-read member extending substantially parallel to the output shaft on a side opposite to the stator of the opposed linear motor with the core across the output shaft; and a second position detector disposed on the side opposite to the output shaft across the second to-be-read member and configured to detect a position of the second to-be-read member.

8. The rotary head according to claim 3, wherein the holding member drive and the valve drive overlap each other when viewed from the direction of the rotation axis.

9. The rotary head according to claim 8, further comprising:

a second to-be-read member provided on an output shaft to which the mover of the opposed linear motor with the core of the valve drive is attached, the second to-be-read member extending substantially parallel to the output shaft on a side opposite to the stator of the opposed linear motor with the core across the output shaft; and a second position detector disposed on the side opposite to the output shaft across the second to-be-read member and configured to detect a position of the second to-be-read member.

10. The rotary head according to claim 3, further comprising:

a second to-be-read member provided on an output shaft to which the mover of the opposed linear motor with the core of the valve drive is attached, the second to-be-read member extending substantially parallel to the output shaft on a side opposite to the stator of the opposed linear motor with the core across the output shaft; and a second position detector disposed on the side opposite to the output shaft across the second to-be-read member and configured to detect a position of the second to-be-read member.

11. A rotary head of a surface mounter, comprising:

a rotating body;

a rotation drive configured to rotate and drive the rotating body;

a plurality of suction nozzles attached to the rotating body in such a manner as to be movable in a direction of a rotation axis of the rotating body, the plurality of suction nozzles being arranged on a virtual circle with the rotation axis as the center, the plurality of suction nozzles being configured to cause a component to adhere to a distal end portion thereof by using negative pressure and release the adhering component by using positive pressure;

a holding member drive configured to move, in the direction of the rotation axis, the suction nozzle that has moved to a predetermined drive position on the virtual circle;

a plurality of valves attached to the rotating body in such a manner as to be movable between a negative pressure supply position that supplies the negative pressure to the suction nozzle and a positive pressure supply position that supplies the positive pressure to the suction nozzle; and a valve drive including an opposed linear motor with a core, the valve drive being configured to use the opposed linear motor with the core to move the valve corresponding to the suction nozzle that has moved to the drive position, between the negative pressure supply position and the positive pressure supply position.

12. The rotary head according to claim 11, wherein the valve drive is disposed around the rotating body on any virtual straight line orthogonal to the rotation axis in an orientation where a mover of the opposed linear motor with the core of the valve drive moves in the direction of the rotation axis, and in an orientation where a stator and the mover of the opposed linear motor with the core are arranged in a tangent direction to the virtual circle at a point of intersection of the virtual circle and the virtual straight line.

13. The rotary head according to claim 12, wherein the holding member drive and the valve drive overlap each other when viewed from the direction of the rotation axis.

14. The rotary head according to claim 13, further comprising:

a second to-be-read member provided on an output shaft to which the mover of the opposed linear motor with the core of the valve drive is attached, the second to-be-read member extending substantially parallel to the output shaft on a side opposite to the stator of the opposed linear motor with the core across the output shaft; and a second position detector disposed on the side opposite to the output shaft across the second to-be-read member and configured to detect a position of the second to-be-read member.

15. The rotary head according to claim 12, further comprising:

a second to-be-read member provided on an output shaft to which the mover of the opposed linear motor with the core of the valve drive is attached, the second to-be-read member extending substantially parallel to the output shaft on a side opposite to the stator of the opposed linear motor with the core across the output shaft; and a second position detector disposed on the side opposite to the output shaft across the second to-be-read member and configured to detect a position of the second to-be-read member.

16. The rotary head according to claim 11, wherein the holding member drive and the valve drive overlap each other when viewed from the direction of the rotation axis.

17. The rotary head according to claim 16, further comprising:

a second to-be-read member provided on an output shaft to which the mover of the opposed linear motor with the core of the valve drive is attached, the second to-be-read member extending substantially parallel to the output shaft on a side opposite to the stator of the opposed linear motor with the core across the output shaft; and a second position detector disposed on the side opposite to the output shaft across the second to-be-read member and configured to detect a position of the second to-be-read member.

18. The rotary head according to claim 11, further comprising:

a second to-be-read member provided on an output shaft to which the mover of the opposed linear motor with the core of the valve drive is attached, the second to-be-read member extending substantially parallel to the output shaft on a side opposite to the stator of the opposed linear motor with the core across the output shaft; and a second position detector disposed on the side opposite to the output shaft across the second to-be-read member and configured to detect a position of the second to-be-read member.

* * * * *